United States Patent [19]
Zenke

[11] Patent Number: 5,969,381
[45] Date of Patent: Oct. 19, 1999

[54] SEMICONDUCTOR DEVICE WITH UNBREAKABLE TESTING ELEMENTS FOR EVALUATING COMPONENTS AND PROCESS OF FABRICATION THEREOF

[75] Inventor: Masanobu Zenke, Tokyo, Japan

[73] Assignee: NEC Corporation, Tokyo, Japan

[21] Appl. No.: 08/805,973

[22] Filed: Feb. 26, 1997

[51] Int. Cl.[6] .......................... H01L 27/108; H01L 29/76; H01L 29/94; H01L 31/119
[52] U.S. Cl. ............................. 257/308; 257/311
[58] Field of Search ..................... 438/241, 253, 438/254, 18; 257/306, 308, 311

[56] References Cited

U.S. PATENT DOCUMENTS

| | | | |
|---|---|---|---|
| 5,661,065 | 8/1997 | Koga | 438/253 |
| 5,744,389 | 4/1998 | Kim | 438/253 |
| 5,759,893 | 6/1998 | Wu | 438/254 |

FOREIGN PATENT DOCUMENTS 1-270344  10/1989  Japan.

*Primary Examiner*—Brian Dutton
*Attorney, Agent, or Firm*—Sughrue, Mion, Zinn, Macpeak & Seas, PLLC

[57] ABSTRACT

Testing elements are disposed to prevent breakage by locating them such that their entire lower surface is formed directly on an insulating layer of a semiconductor device. These testing elements may be used with a fin type storage node electrode projecting from an inter-level insulating layer so as to use the top, side and back surfaces thereof for accumulation of electric charge. These testing elements may be used for evaluating properties of the layers of the storage node electrode and be concurrently formed directly on the inter-level insulating layer, thereby preventing the testing elements from undesirable breakage.

7 Claims, 23 Drawing Sheets

SEMICONDUCTOR DEVICE WITH UNBREAKABLE TESTING ELEMENTS FOR EVALUATING COMPONENTS AND PROCESS OF FABRICATION THEREOF

FIELD OF THE INVENTION

This invention relates to a semiconductor device and, more particularly, to a semiconductor device accompanied with testing elements for evaluating components of the semiconductor device and a process of fabrication thereof.

DESCRIPTION OF THE RELATED ART

A typical dynamic random access memory cell is implemented by a series combination of a single field effect transistor and a single storage capacitor. The semiconductor dynamic random access memory device has increased the dynamic random access memory cells, and, accordingly, a real estate occupied by each memory cell is getting narrower and narrower. On the other hand, if the capacitance of the storage capacitor is too small, the data bit stored therein tends to be lost due to the presence of an alpha-particle. For this reason, the manufacturer is required to decrease the occupation area assigned to each dynamic random access memory cell without reduction of the capacitance of the storage capacitor.

One of the approaches is to give a complicated three-dimensional configuration to the storage electrode. This results in increase of the surface area of the storage electrode opposed to the cell plate electrode, and, accordingly, the capacitance is increased without a wide occupation area.

A typical example of the complicated three-dimensional configuration is disclosed in Japanese Patent Publication of Unexamined Application No. 1-270344. The configuration of the storage node electrode is called a "fin structure" or "fin storage node electrode", and the fin storage node electrode opposes not only the top surface and the side surface but also the back surface to the cell plate, and widely increases the capacitance of the storage capacitor. The fin storage node electrode is located over the associated field effect transistor, and a bit line passes through an inter-level insulating layer between the field effect transistor and the fin storage node electrode. This feature is called a COB (Capacitor-Over-Bit line) structure.

Testing elements are usually incorporated in a semiconductor device, and are used for evaluating components of the semiconductor device. Of course, various testing elements are incorporated in the semiconductor dynamic random access memory device, and some testing elements are used for evaluating the storage node electrode. The manufacturer evaluates a mis-alignment between a node contact hole and a storage node electrode by using one of the testing elements, and measures a sheet resistance of the conductive material for the storage node electrode through another testing element. The manufacturer further checks yet another testing element to see whether or not a short-circuit takes place between adjacent two storage node electrodes.

FIG. 1 illustrates the layout of a typical example of the semiconductor dynamic random access memory device. The prior art semiconductor dynamic random access memory device is fabricated on a p-type silicon substrate 1. The prior art semiconductor dynamic random access memory device comprises a memory cell array 2, peripheral circuits such as a row address decoder 3a and a column address decoder 3b and testing elements 4a, 4b and 4c. A plurality of memory cells 2a form the memory cell array 2, and are arranged in rows and columns. The row address decoder 3a selects a row of memory cells 2a from the memory cell array 2, and the column address decoder 3b selects a memory cell 2a from the selected row of memory cells 2a.

The memory cell array 2 occupies a central area of the semiconductor substrate 1, and the peripheral circuits are located in an inner peripheral area around the memory cell array 2. In this instance, the row address decoder 3a extends along one edge of the central area, and the column address decoder 3b is provided along another edge of the central area perpendicular to the edge. The testing elements 4a to 4c are assigned to an outer peripheral area around the inner peripheral area, and are located outside of the peripheral circuits. Thus, the memory cell array 2, the peripheral circuits 3a/3b and the testing elements 4a/4b/4c are assigned the central area, the inner peripheral area and the outer peripheral area, respectively.

FIG. 2 illustrates the layout of the memory cell array. A dielectric film and a cell plate electrode are deleted from the layout for the sake of simplicity. One of the memory cells 2a is enclosed with broken line BKN, and includes a switching transistor 5 and a stacked type storage capacitor 6.

An n-type impurity region 1a is shaped between two switching transistors 5 of adjacent two memory cells 2a, and is electrically connected to a bit line 7a through a bit line contact hole 8a. The bit line contact holes 8a are marked with "x" in FIG. 2 so as to be easily discriminated.

The half of the n-type impurity region 1a on the right side is assigned to the switching transistor 5 for the memory cell 2a enclosed with broken line BKN, and a word line 7b extends over the half of the n-type impurity region 1a. A part of the n-type impurity region 1a on the left side of the word line 7b and another part of the n-type impurity region 1a on the right side of the word line 7b serve as a drain region 5a and a source region 5b of the switching transistor 5.

The source region 5b is electrically connected to a storage node electrode 6b through a node contact hole 8b also marked with "x", and the storage node electrode 6b is opposed through a dielectric film (not shown in FIG. 2) to the cell plate (also not shown in FIG. 2). The storage node electrode 6b is elongated in a direction parallel to the bit line 7a, and occupies an area over two word lines 7b. The rows 2b of memory cells are alternated with the bit lines 7a, and the bit lines 7a extend in an inter-level insulating layer (not shown in FIG. 2) between the word lines 7b and the storage node electrodes 6b in a perpendicular direction to the word lines 7b. The word lines 7b are connected to the row address decoder 3a, and the bit lines 7a are connected to the column address decoder 3b.

FIGS. 3A to 3C illustrates the layouts of the testing elements 4a, 4b and 4c, respectively. The manufacturer uses the testing element 4a to evaluate the alignment between the node contact holes 8b and the stem portions of the storage node electrodes 6b, and includes contact holes 4d marked with "x" and a polysilicon pattern 4e as shown in FIG. 3A. The contact holes 4d are formed in an inter-level insulating layer (not shown in FIGS. 2 and 3A) concurrently with the node contact holes 8b, and are spaced from each other at predetermined intervals. On the other hand, the polysilicon pattern 4e is constituted by a plurality of polysilicon strips 4f spaced at the predetermined intervals, and the polysilicon strips 4f are patterned from a polysilicon layer concurrently with the storage node electrodes 6b. The contact holes 4d have a width equal to the width of the storage node electrodes 6b, and the length of the contact holes 4d is much longer than the length of the storage node electrodes 6b. The polysilicon strips 4f have a width equal to the width of the storage node electrodes 6b, and the length of the polysilicon strips 4f is equal to the length of the contact holes 4d. Therefore, a mis-alignment between the node contact holes 8b and the stems of the storage node electrodes 6b is transferred to the alignment between the contact holes 4d and the polysilicon strips 4f.

The manufacturer uses the testing element 4b so as to measure the sheet resistance of the polysilicon for the storage node electrodes 6b. The testing element 4b is implemented by a polysilicon test pattern 4g, and a plurality of polysilicon strips 4h form in combination the polysilicon test pattern 4g. The polysilicon strips 4h are patterned from the polysilicon layer for the storage node electrodes 6b, and are broken down into three groups. All of the polysilicon strips 4h have respective pad portions 4i of ten microns square, and the pad portions 4i are wide enough to allow a probe (not shown) to come into contact therewith. Narrow portions 4j, 4k and 4m project from the pad portions 4i, and are different in width from one another. The narrow portions 4j are equal to the width of the storage node electrodes 6b. However, the narrow portions 4k are, by way of example, twice as wide as the storage node electrodes 6b, and the narrow portions 4m are, by way of example, four times as wide as the storage node electrodes 6b. The sheet resistance is usually measured before the formation of the dielectric films on the storage node electrodes 6b.

The manufacturer checks the testing element 4c to determine whether or not the storage node electrodes 6b are short circuited. The testing element 4c has n-type impurity regions (not shown in FIG. 3C) concurrently formed together with the source and drain regions 5a/5b, a plurality of contact holes 4p, which are marked with "x", formed in the inter-level insulating layer concurrently with the node contact holes 8b and a plurality of polysilicon strips 4qa, 4qb, . . . formed from the polysilicon layer concurrently with the storage node electrodes 6b. The polysilicon strips 4qa and 4qb are wider than the storage node electrodes 6b, and are spaced from each other by a gap equal to that between the adjacent storage node electrodes 6b. The polysilicon strips 4qa and 4qb are much longer than the storage node electrodes 6b, and are of the order of 1 millimeter. The contact holes 4p are equal in dimensions to the note contact holes 8b. Although the polysilicon strip 4qa is electrically connected through the contact holes 4p to the impurity region, no contact hole is formed beneath the polysilicon strip 4qb, because the manufacturer does not expect the testing element 4c to detect a short-circuit between the impurity regions. The manufacturer checks the testing element 4c before the deposition of the dielectric films.

The structure of the prior art semiconductor dynamic random access memory device will now be described with reference to FIGS. 4 and 5A to 5D. FIG. 4 shows the cross section taken along line IV—IV, and the structure of the memory cell and the structure of testing element 4a are seen in the cross section. Although two memory cells 2a are shown in FIG. 4, description is focused on one of the memory cells 2a; however, the components of the other memory cell 2a are labeled with the same references.

A thick field oxide layer 1b is selectively grown on the major surface of the p-type silicon substrate 1, and defines an active area assigned to the two memory cells 2a in the central area. A channel region between the source and drain regions 5a and 5b is covered with a thin gate oxide layer 5c, and the word line 7b extends over the thin gate oxide layer 5c. A part of the word line 7b on the thin gate oxide layer 5c serves as a gate electrode, and the gate electrode, the thin gate oxide layer, the channel region and the source and drain regions 5a/5b as a whole constitute the switching transistor 5.

A silicon oxide layer 8c covers the word lines 7b and exposed major surface, and is overlain by a first inter-level insulating layer 8d. The first inter-level insulating layer 8d is further overlain by a second inter-level insulating layer 8e, and the upper surface of the second inter-level insulating layer 8e is formed with a silicon nitride layer. The second inter-level insulating layer 8e is covered with a dielectric film 8f concurrently deposited together with the dielectric film 6c.

The storage capacitor 6 is formed on the second inter-level insulating layer 8e. The node contact hole 8b passes through the dielectric film 8f, the first and second inter-level insulating layers 8d/8e and the silicon oxide layer 8c, and the source/drain region 5b is exposed to the node contact hole 8b. The stem of the storage node electrode 6b is held in contact through the node contact hole 8b with the source/drain region 5b, and an accumulating portion of the storage node electrode 6b projects from the dielectric film 8f because of the fin structure. The gap between the dielectric film 8f and the accumulating portion is narrower than the gap between the accumulating portions of the adjacent storage node electrodes 6b. The storage node electrode 6b over the dielectric film 8f is covered with the dielectric film 6c, and the dielectric film 6c is covered with the cell plate electrode 6d. The storage node electrode 6b and the cell plate electrode 6d are formed of n-type polysilicon. The storage node electrode 6b, the dielectric film 6c and the cell plate electrode 6d form in combination the storage capacitor 6.

FIG. 5A illustrates the bit line 7a. The bit lines 7a extend over the first inter-level insulating layer 8e, and are held in contact through the bit contact hole 8a with the source/drain region 5a. The bit contact holes 8a are formed in the lamination of the silicon oxide layer 8c and the first inter-level insulating layer 8d, and reach the source/drain regions 5a.

The COB structure is seen in FIG. 5B. The word line 7b extends over the thick field oxide layer 1b and the gate oxide layer 5c, and the bit lines 7a extend on the first inter-level insulating layer 8d over the word line 7b. The storage capacitors 6 are formed on the dielectric film 8f over the bit lines 7a. Thus, the bit lines 7a are formed between the switching transistors 5 and the storage capacitors 6.

Turning back to FIG. 4 of the drawings, the contact hole 4d of the testing element 4a is formed in the lamination of the silicon oxide layer 8c, the first and second inter-level insulating layers 8d/8e and the thick field oxide layer 1b, and reaches the p-type silicon substrate 1. The bottom end of the contact hole 4d may be terminated at the inside of the thick field oxide layer 1b. The polysilicon strip 4f is partially provided over the lamination and partially in the contact hole 4d so as to be held in contact with the p-type silicon substrate 1.

The structure of the testing element 4b is illustrated in FIG. 5C. The polysilicon strips 4m are formed on residual phosphosilicate glass 9a over the second inter-level insulating layer 8e, and a gap takes place between the dielectric film 8f and the polysilicon strips 4m. The polysilicon strips 4k/4j are spaced from the dielectric film 8f, and some polysilicon strips 4j are broken as indicated by a broken line. The polysilicon strips 4k/4m are covered with dielectric films 4r deposited concurrently with the dielectric film 6c, and the residual n-type polysilicon fills the gap between the dielectric film 8f and the dielectric film 4r. The dielectric film 4r and the residual n-type polysilicon 4s are also observed in the structure of the testing element 4a (see FIG. 4).

The structure of the testing element 4c is illustrated in FIG. 5D. The polysilicon strips 4qa and 4qb are patterned on the residual phosphosilicate glass 9c over the second inter-level insulating layer 8e, and a gap takes place between the dielectric film 8f and the polysilicon strips 4qa/4qb. The polysilicon strips 4qa/4qb are covered with the dielectric films 4r, and the residual n-type polysilicon 4s fills the gap between the dielectric films 4r and the dielectric film 8f. As described hereinbefore, the polysilicon strip 4qa is held in contact through the contact hole 4p with the n-type impurity region, and the n-type impurity region is labeled with reference 4n.

The prior art semiconductor dynamic random access memory device is fabricated as follows. FIGS. 6A to 6E illustrate the prior art process sequence, and show the cross section taken along line VI—VI of FIG. 1.

First, the p-type silicon substrate 1 is prepared. The thick field oxide layer 1b is selectively grown on the major surface of the p-type silicon substrate 1, and defines the active area assigned to two memory cells 2a.

The thin gate oxide layers 5c are grown on the active area, and polysilicon is deposited over the entire surface of the structure. A photo-resist etching mask (not shown) is formed on the polysilicon layer by using lithographic techniques, and the polysilicon layer is patterned into the word lines 7b. N-type dopant impurity is ion implanted into the active area, and forms the n-type source/drain regions 5a/5b in a self-aligned manner with the word lines 7b on the gate oxide layers 5c. The n-type dopant impurity further forms the n-type impurity regions 4n of the testing element 4c. Thus, the switching transistors 5 are fabricated on the p-type silicon substrate 1.

Subsequently, silicon oxide is deposited over the entire surface of the resultant structure by using a low-pressure chemical vapor deposition, and the thick field oxide layer 1b, the word lines 7b and the n-type source/drain regions 5a/5b are covered with the silicon oxide layer 8c. Boro-phosphosilicate glass is deposited over the silicon oxide layer, and the boro-phosphosilicate glass layer is reflowed. Silicon oxide is deposited over the boro-phosphosilicate glass layer, and the boro-phosphosilicate glass layer and the silicon oxide layer form in combination the first inter-level insulating layer 8d.

A photo-resist etching mask (not shown) is formed on the first inter-level insulating layer 8d, and the first inter-level insulating layer 8d and the silicon oxide layer 8c are selectively etched away so as to form the bit contact holes 8a (not shown in FIGS. 6A to 6E). Conductive material is deposited over the first inter-level insulating layer. The conductive material fills the bit contact holes 8a, and swells into a conductive material layer. A photo-resist etching mask (not shown) is formed on the conductive material layer, and is patterned into the bit lines 7a (not shown in FIGS. 6A to 6E).

Boro-phosphosilicate glass is deposited over the bit lines 7a on the first inter-level insulating layer 8d, and the boro-phosphosilicate glass layer is reflowed. Silicon nitride is deposited over the boro-phosphosilicate glass layer, and the boro-phosphosilicate glass layer and the silicon nitride layer form in combination the second inter-level insulating layer 8e. On the silicon nitride layer of the second inter-level insulating layer is deposited phosphosilicate glass which forms a spacing layer 9a as shown in FIG. 6A.

A photo-resist etching mask (not shown) is formed on the spacing layer 9a, and the spacing layer 9a, the first and second inter-level insulating layers 8d/8e and the silicon oxide layer 8c are selectively removed so as to form the node contact holes 8b and the contact holes 4p of the testing element 4c. The photo-resist etching mask allows the etchant to further selectively remove the spacing layer 9a, the first and second inter-level insulating layers 8d/8e, the silicon oxide layer 8c and the thick field oxide layer 1b so as to form the contact holes 4d of the testing element 4a. The node contact holes 8b reach the n-type source/drain regions 5b, and, accordingly, the n-type source/drain regions 5b are exposed to the node contact holes 8b as shown in FIG. 6B. The n-type impurity region 4n is exposed to the contact hole 4p, and the p-type silicon substrate 1 is exposed to the contact holes 4d.

Subsequently, n-type polysilicon is deposited over the entire surface of the spacing layer 9a. The n-type polysilicon fills the node contact holes 8b and the contact holes 4d/4p, and swells into an n-type polysilicon layer 9b as shown in FIG. 6C.

A photo-resist etching mask (not shown) is formed on the n-type polysilicon layer 9b, and the n-type polysilicon layer 9b is patterned into the storage node electrodes 6b and the polysilicon strips 4f, 4h, 4qa and 4qb as shown in FIG. 6D.

Using dilute hydrofluoric acid, the spacing layer 9a is isotropically etched away, and a gap takes place between the storage node electrodes/ the narrow polysilicon strips 6b/4f/4j/4k and the second inter-level insulating layer 8e as shown in FIG. 6E. However, the phosphosilicate glass 9c is left under the wide polysilicon strips 4h and 4m (see FIGS. 5C and 5D). The dielectric film is formed on the storage node electrodes 6b, and, accordingly, the polysilicon strips 4f, 4h, 4qa, 4qb and the second inter-level insulating layer 8e are covered with the same dielectric films 8f and 4r. Finally, the n-type polysilicon is deposited over the entire surface of the structure, and the n-type polysilicon layer is patterned into the cell plate electrodes 6d.

However, the prior art semiconductor dynamic random access memory device encounters a problem in that the testing elements are broken before the evaluation. This means that the manufacturer can not reliability evaluate the components by using the testing elements 4a to 4c, and the measured values are not matched with the actual properties of the components. In fact, some measured sheet resistances obtained from the testing elements 4b are larger in value than the sheet resistance of the storage node electrode 6c. Although the testing element 4c does not inform the manufacturer of a short-circuit, the storage node electrodes 6b are actually short-circuited.

SUMMARY OF THE INVENTION

It is therefore an important object of the present invention to provide a semiconductor device which has unbreakable testing elements.

It is also an important object of the present invention to provide a process of fabricating the semiconductor device with the unbreakable testing elements.

The present inventor contemplated the problem of the prior art semiconductor dynamic random access memory device, and noticed that the broken testing elements were narrow polysilicon strips 4j and 4k. The polysilicon strips 4j were much more likely to be broken rather than the polysilicon strips 4k. On the other hand, although some peripheries of the wide polysilicon strips such as 4f, 4i, 4m and 4qa/4qb were chipped off, no wide polysilicon strips 4f, 4i, 4m and 4qa/4qb were completely broken. The polysilicon strips 4f were supported by the p-type silicon substrate 1, and the polysilicon strips 4m and 4qa/4qb were supported by the residual phosphosilicate glass 9c. However, there was no support beneath the polysilicon strips 4k/4j. The present inventor concluded that the narrow polysilicon strips 4k and 4m were too small in strength to withstand the pressing force of the probe. The polysilicon strips that were chipped off increased the sheet resistance, and the broken pieces short circuited the storage node electrodes 6b.

To accomplish the object, the present invention proposes to provide testing elements directly on an inter-level insulating layer.

In accordance with one aspect of the present invention, there is provided a semiconductor device fabricated on a semiconductor substrate, comprising: an inter-level insulating structure formed over a major surface of the semiconductor substrate; at least one circuit component formed on a first area of an upper surface of the inter-level insulating structure, and having a first member projecting from the first area of the inter-level insulating structure; and at least one testing element having at least one second member held in contact with a second area of the upper surface of the inter-level insulating structure and used for evaluating the first member of the at least one circuit component.

In accordance with another aspect of the present invention, there is provided a process of fabricating a semiconductor device, comprising the steps of: a) preparing a semiconductor substrate having a major surface containing a first area and a second area; b) forming an inter-level insulating structure over the major surface of the semiconductor substrate; c) forming a spacing layer on the inter-level insulating structure; d) removing a part of the spacing layer from a part of the inter-level insulating layer over the second area; e) forming a certain layer extending over a remaining part of the spacing layer over the first area and the part of the inter-level insulating layer; f) patterning the certain layer into a first member of at least one circuit component on the remaining part of the spacing layer and at least one second member of a testing element on the part of the inter-level insulating layer; g) removing the remaining part of the spacing layer so that the first member projects from the remaining part of the spacing layer; h) evaluating the first member by measuring a predetermined physical quantity of the at least one second member; and i) completing the at least one circuit component.

BRIEF DESCRIPTION OF THE DRAWINGS

The features and advantages of the semiconductor memory device and the process according to the present invention will be more clearly understood from the following description taken in conjunction with the accompanying drawings in which.

DESCRIPTION OF THE PREFERRED EMBODIMENTS

First Embodiment

Figure 1:
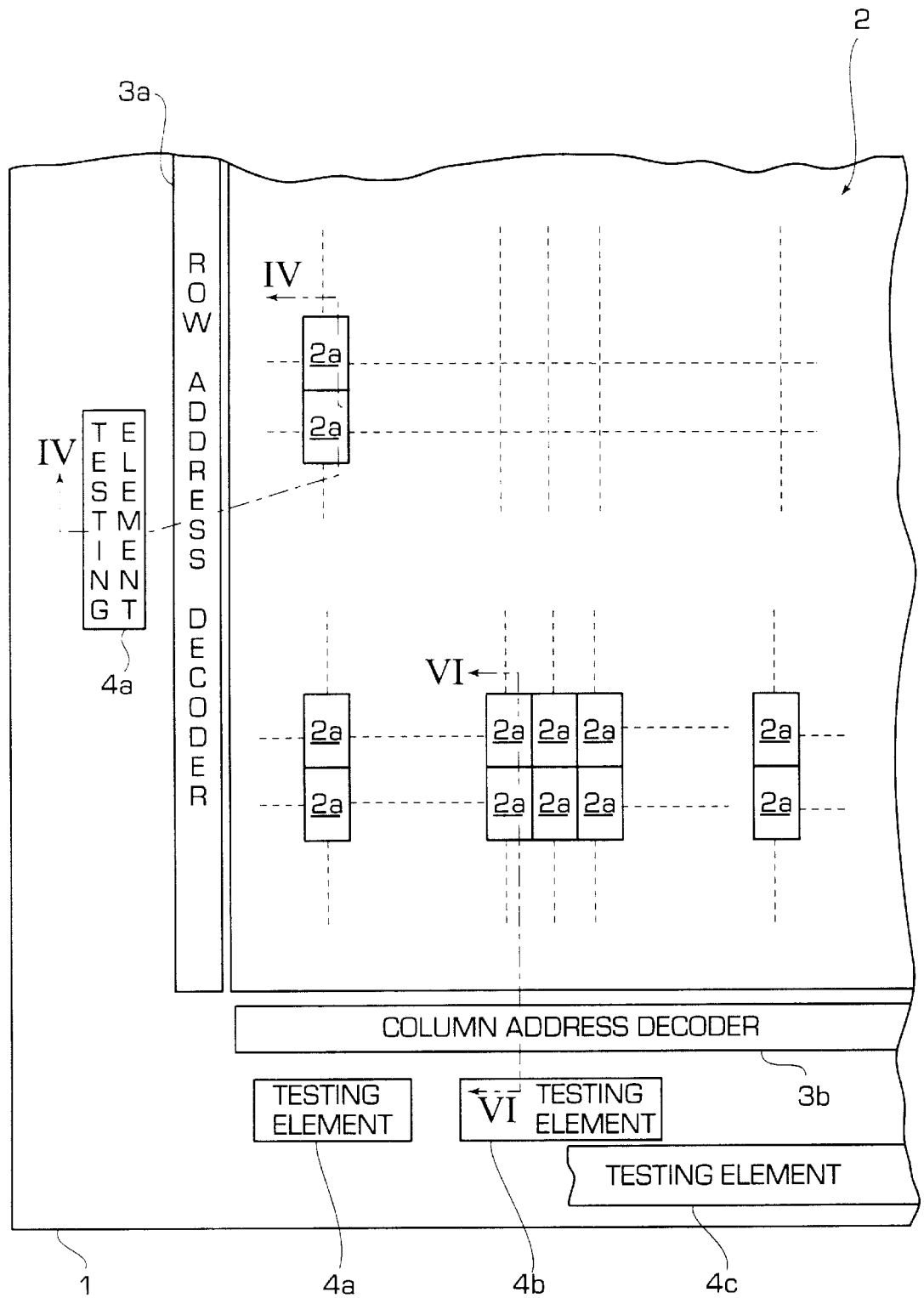
FIG. 1 is a plan view showing the layout of the prior art semiconductor dynamic random access memory device.
Figure 2:
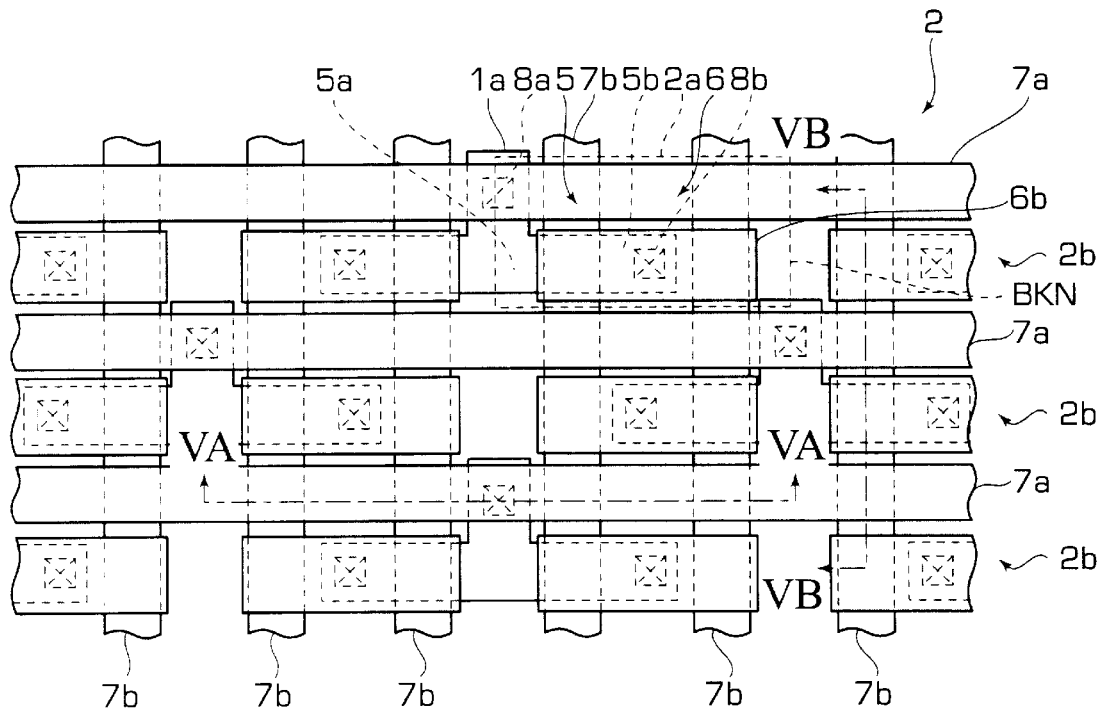
FIG. 2 is a plan view showing the layout of the memory cell array incorporated in the prior art semiconductor dynamic random access memory device.
Figure 3A:
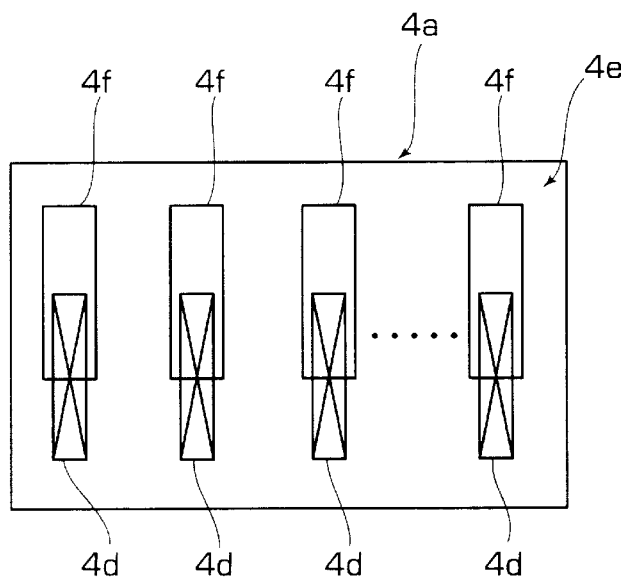
FIGS. 3A to 3C are plan views showing the layouts of the testing elements incorporated in the prior art semiconductor dynamic random access memory device.
Figure 3B:
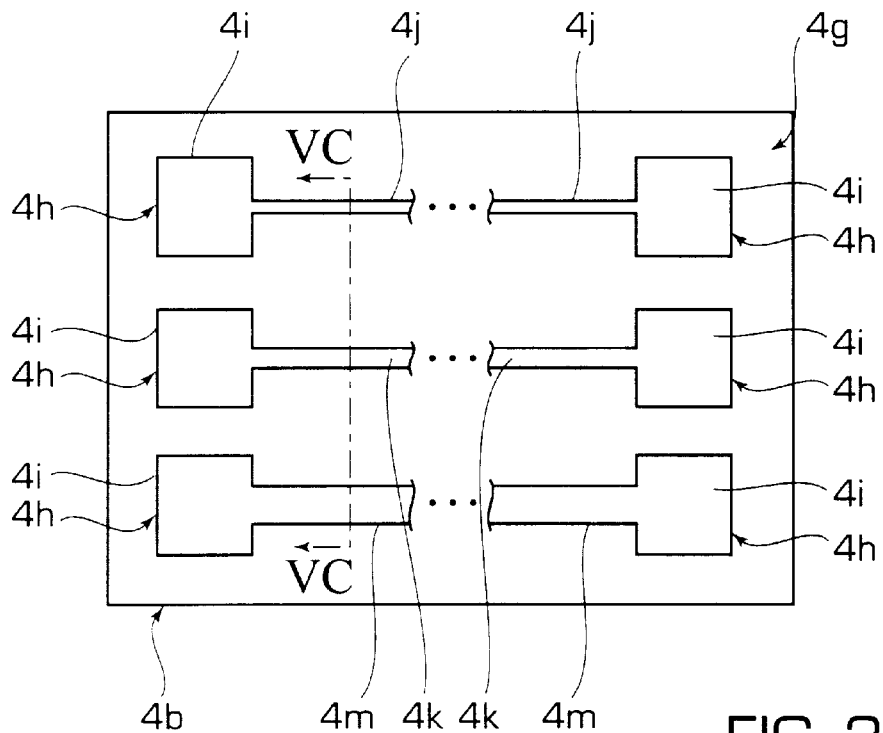
Figure 3C:
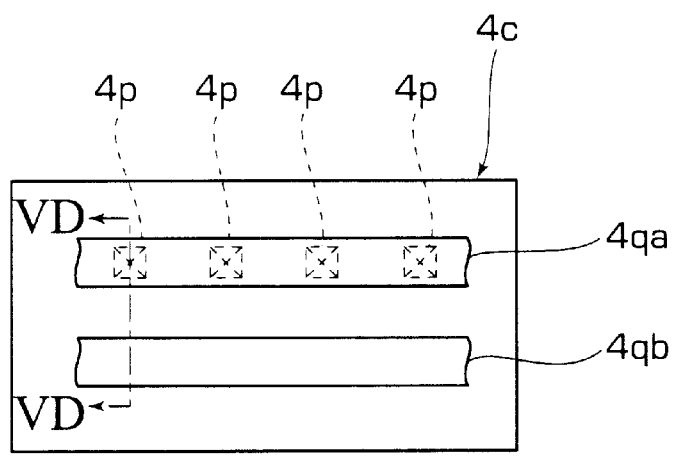
Figure 4:
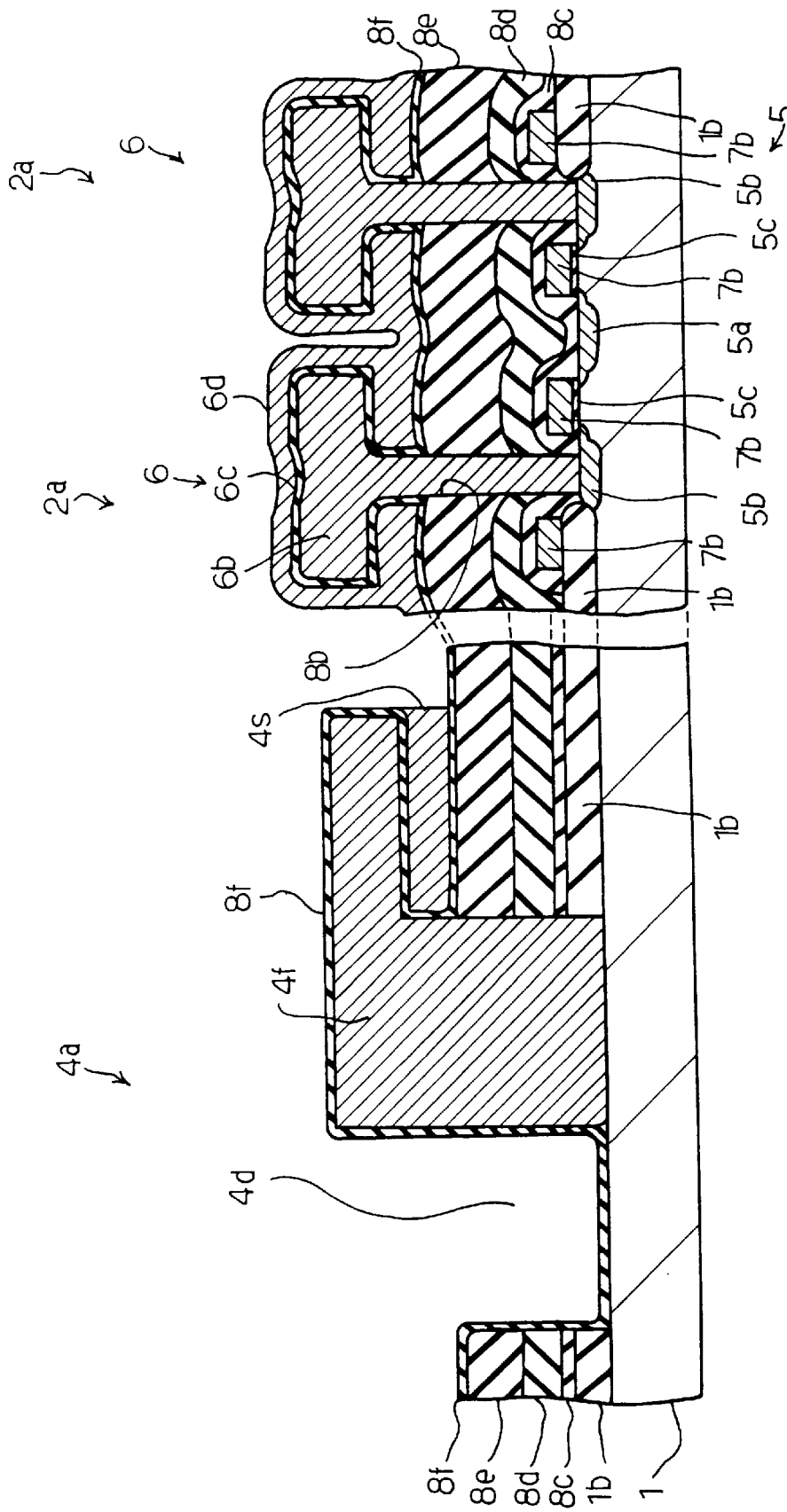
FIG. 4 is a cross sectional views taken along line IV—IV of FIG. 1 and showing the structure of the memory cell and the testing element.
Figure 5A:
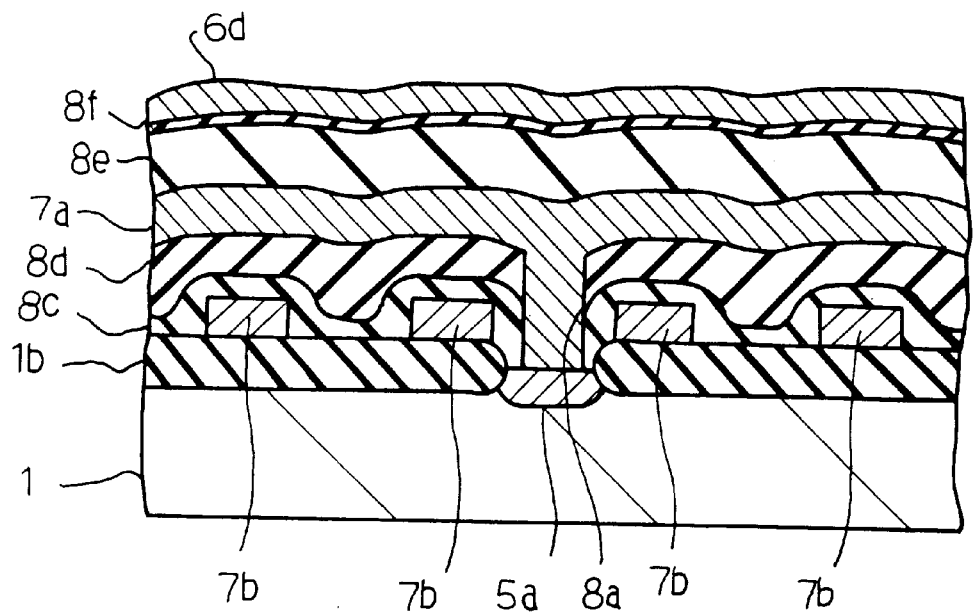
FIGS. 5A to 5D are cross sectional views taken along lines V.A—V.A, V.B—V.B, V.C—V.C and V.D—V.D of FIGS. 2, 3B and 3C and showing the structures of the testing elements.
Figure 5B:
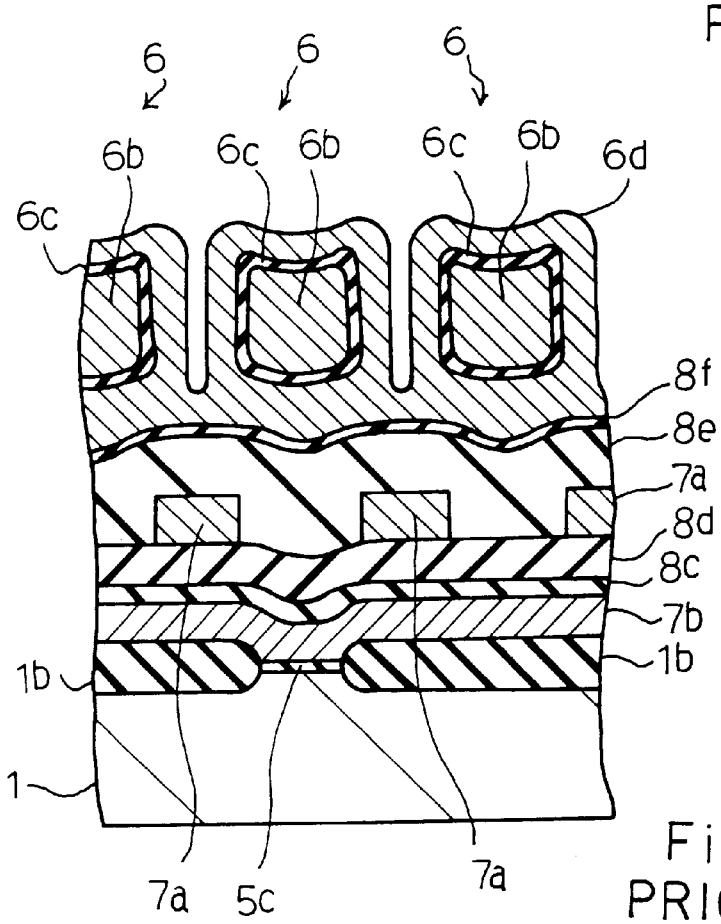
Figure 5C:
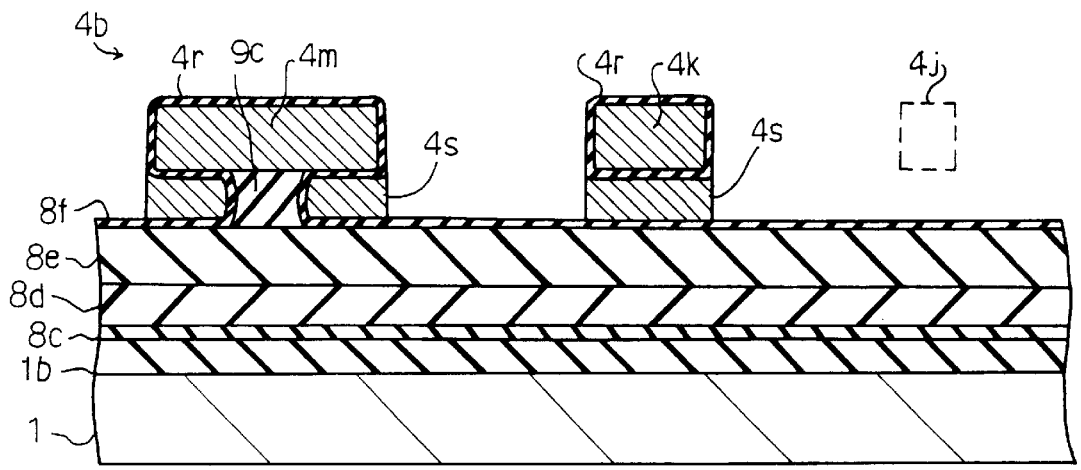
Figure 5D:
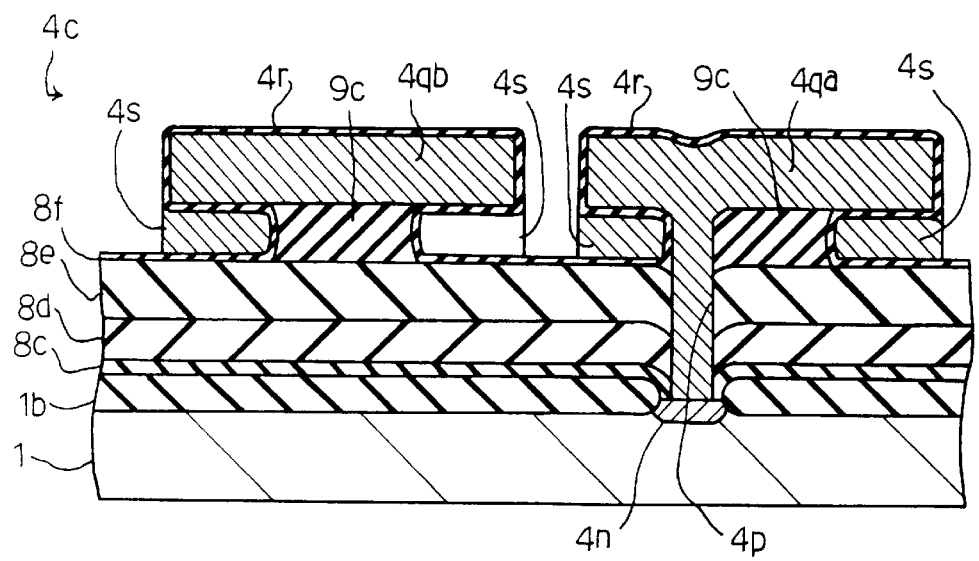
Figure 6A:
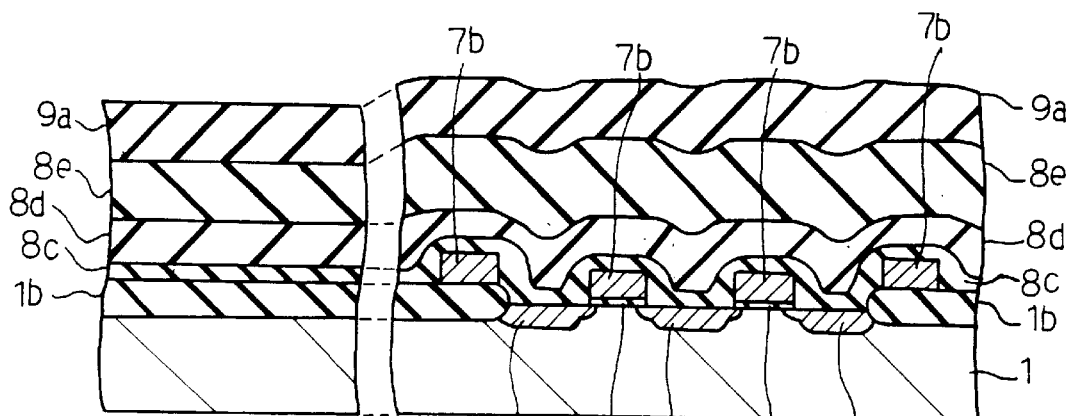
FIGS. 6A to 6E are cross sectional views showing the process sequence of fabricating the prior art semiconductor dynamic random access memory device.
Figure 6B:
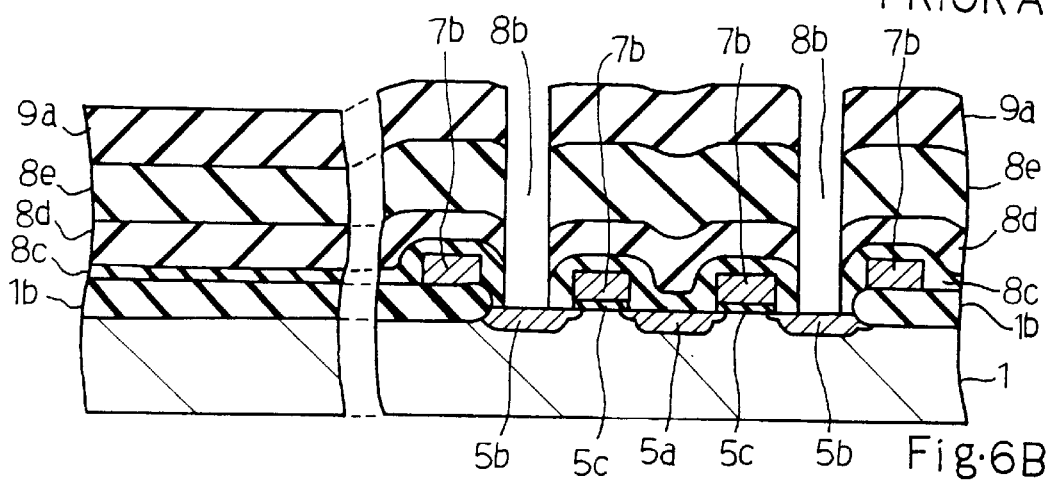
Figure 6C:
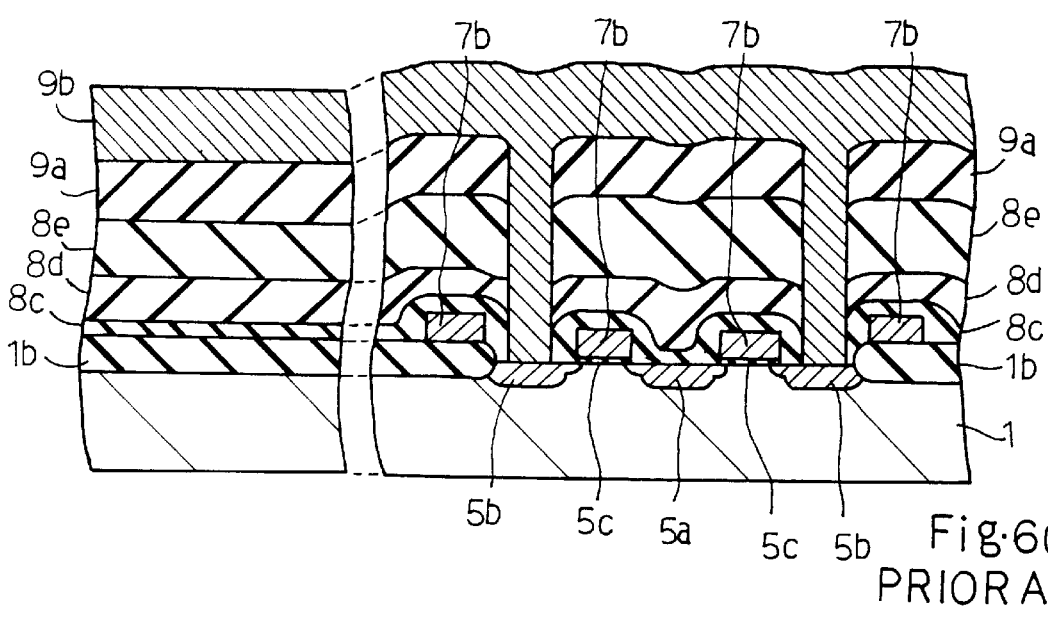
Figure 6D:
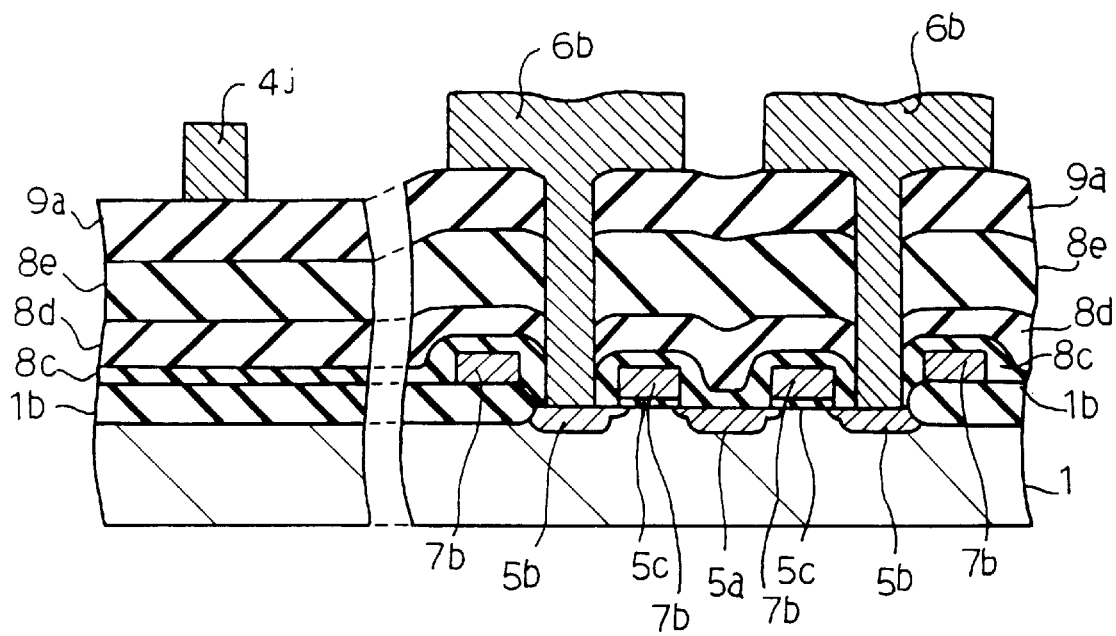
Figure 6E:
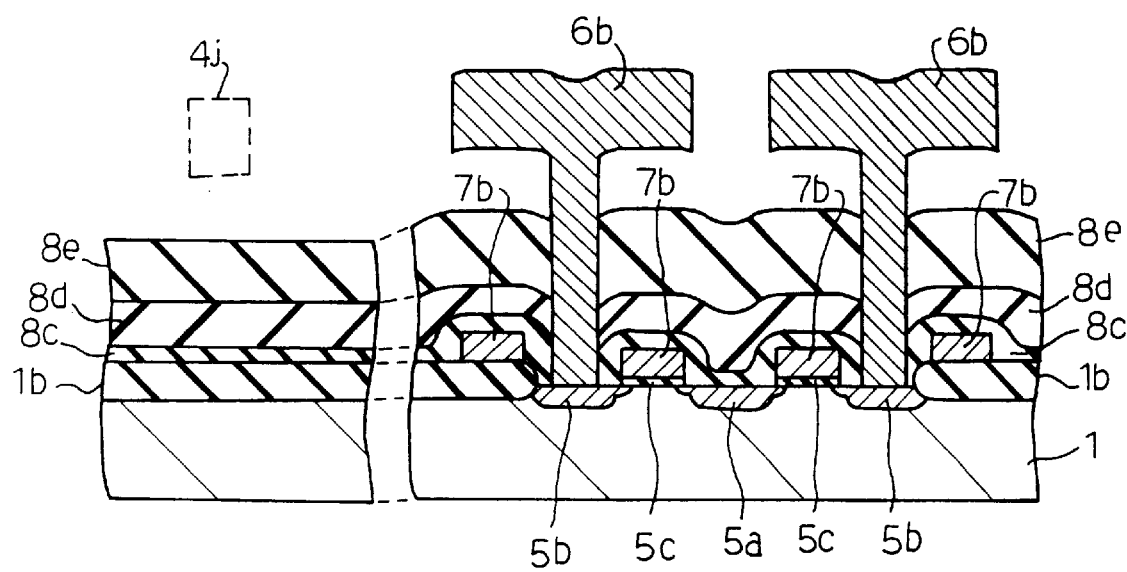
Figure 7:
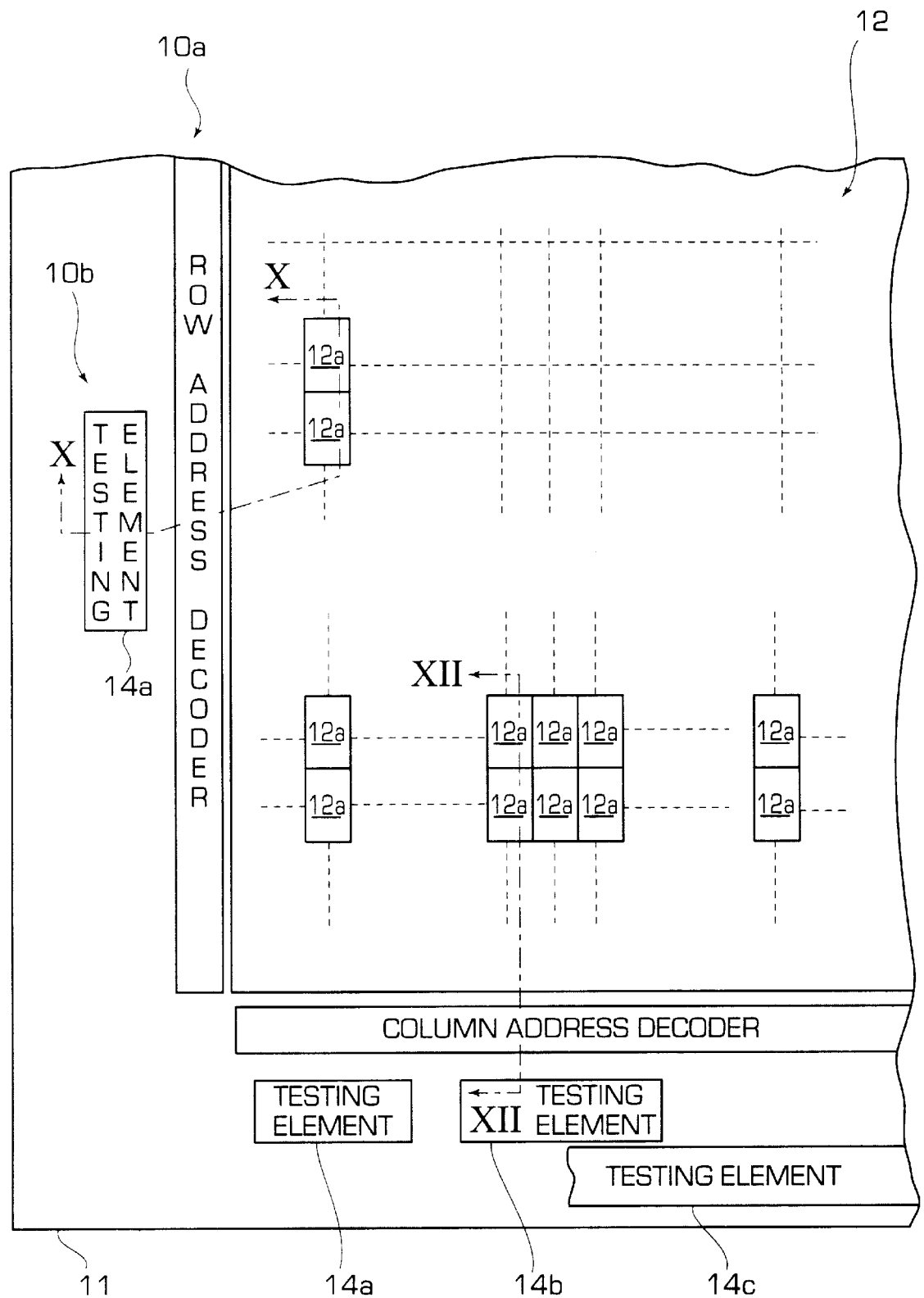
FIG. 7 is a plan view showing the layout of a semiconductor dynamic random access memory device according to the present invention.

Referring first to FIG. 7, a semiconductor device largely comprises a dynamic random access memory 10a and a testing facility 10b, and the dynamic random access memory 10a and the testing facility 10b are fabricated on a p-type silicon substrate 11.

The prior art semiconductor dynamic random access memory device includes a memory cell array 12 and peripheral circuits such as a row address decoder 13a and a column address decoder 13b, and testing elements 14a, 14b and 14c are incorporated in the testing facility 10b.

A plurality of memory cells 12a form the memory cell array 12, and are arranged in rows and columns. The row address decoder 13a selects a row of memory cells 12a from the memory cell array 12, and the column address decoder 13b selects a memory cell 12a from the selected row of memory cells 12a.

The memory cell array 12 occupies a central area of the semiconductor substrate 11, and each memory cell 12a occupies an area of 0.9 micron by 1.8 microns. The peripheral circuits are located in an inner peripheral area around the memory cell array 12. In this instance, the row address decoder 13a extends along one edge of the central area, and the column address decoder 13b is provided along another edge of the central area perpendicular to the edge. The testing elements 14a to 14c are assigned to an outer peripheral area around the inner peripheral area, and are located outside of the peripheral circuits. Thus, the memory cell array 12, the peripheral circuits 13a/13b and the testing elements 14a/14b/14c are assigned the central area, the inner peripheral area and the outer peripheral area, respectively.

Figure 8:
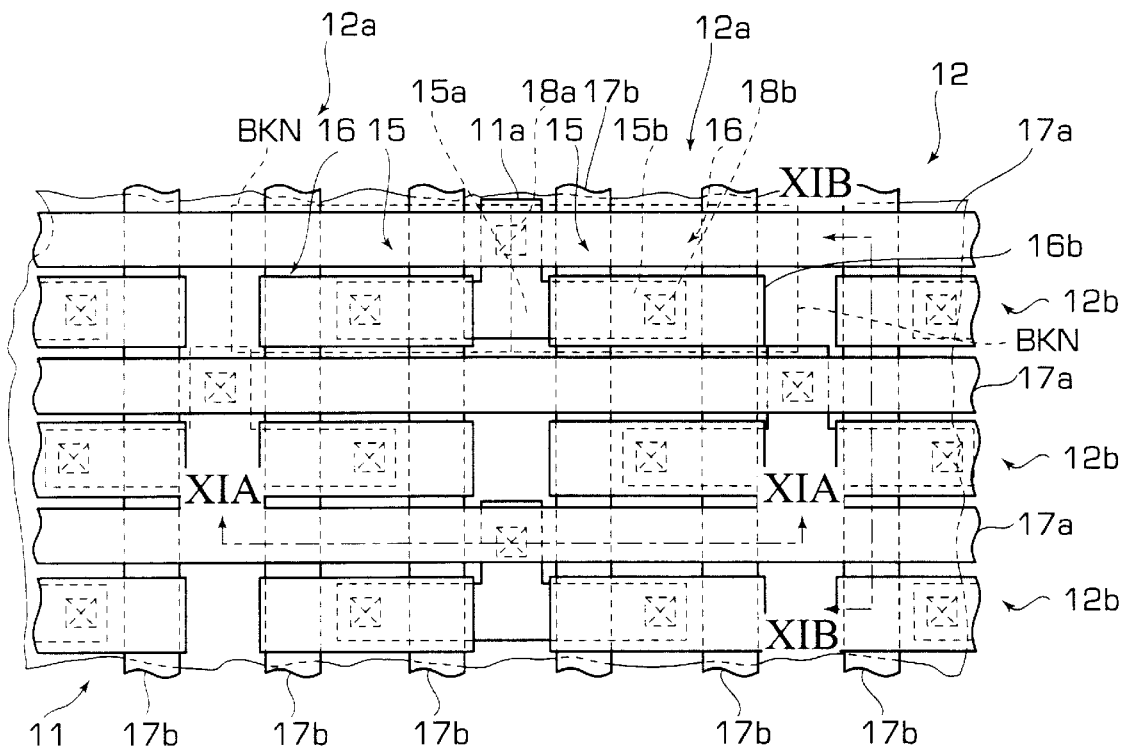
FIG. 8 is a plan view showing the layout of the memory cell array incorporated in the semiconductor dynamic random access memory device.

FIG. 8 illustrates the layout of the memory cell array 12. A dielectric film and a cell plate electrode are deleted from the layout of the memory cell array 12 for the sake of simplicity. Adjacent two of the memory cells 12a are enclosed with broken lines BKN, and are assigned to an active area. The memory cell 12a includes an n-channel enhancement type switching transistor 15 and a stacked type storage capacitor 16, and the n-channel enhancement type switching transistor 15 is electrically connected in series to the storage capacitor 16.

An n-type impurity region 11a is shaped between the n-channel enhancement type switching transistors 15 of the adjacent two memory cells 12a, and is electrically connected to one of bit lines 17a through a bit line contact hole 18a. The bit line contact holes 18a are marked with "x" in FIG. 8 so as to be easily discriminated.

The half of the n-type impurity region 11a on the right side is assigned to the switching transistor 15 for the memory cell 12a enclosed with right broken line BKN, and one of word lines 17b extends over the half of the n-type impurity region 11a. A part of the n-type impurity region 11a on the left side of the word line 17b and another part of the n-type impurity region 11a on the right side of the word line 17b serve as a drain region 15a and a source region 15b of the switching transistor 15.

A part of the n-type impurity region 11a between the drain region 15a and the source region 15b serves as a channel region, and the channel region is overlapped with a part of the word line 17b serving as a gate electrode. The gate electrode is 0.5 micron in gate length and 0.5 micron in gate width.

The source region 15b is electrically connected to a storage node electrode 16b through a node contact hole 18b also marked with "x", and the storage node electrode 16b is opposed through the dielectric film (not shown in FIG. 8) to the cell plate (also not shown in FIG. 8). The storage node electrode 16b measures 0.4 micron in width and 1.3 micron in length, and adjacent two storage node electrodes 16b are spaced by 0.5 micron. The storage node electrode 16b is elongated in a direction parallel to the bit line 17a, and two word lines 17b are overlapped with the storage node electrode 16b. The rows 12b of memory cells 12a are alternated with the bit lines 17a, and the bit lines 17a extend in an inter-level insulating layer (not shown in FIG. 8) between the word lines 17b and the storage node electrodes 16b in a perpendicular direction to the word lines 17b. The word lines 17b are connected to the row address decoder 13a, and the bit lines 17a are connected to the column address decoder 13b.

Figure 9A:
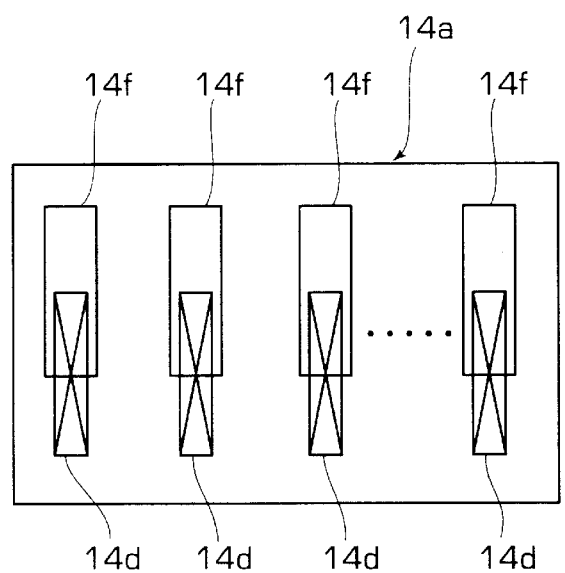
FIGS. 9A to 9C are plan views showing the layouts of the testing elements incorporated in the semiconductor dynamic random access memory device.
Figure 9B:
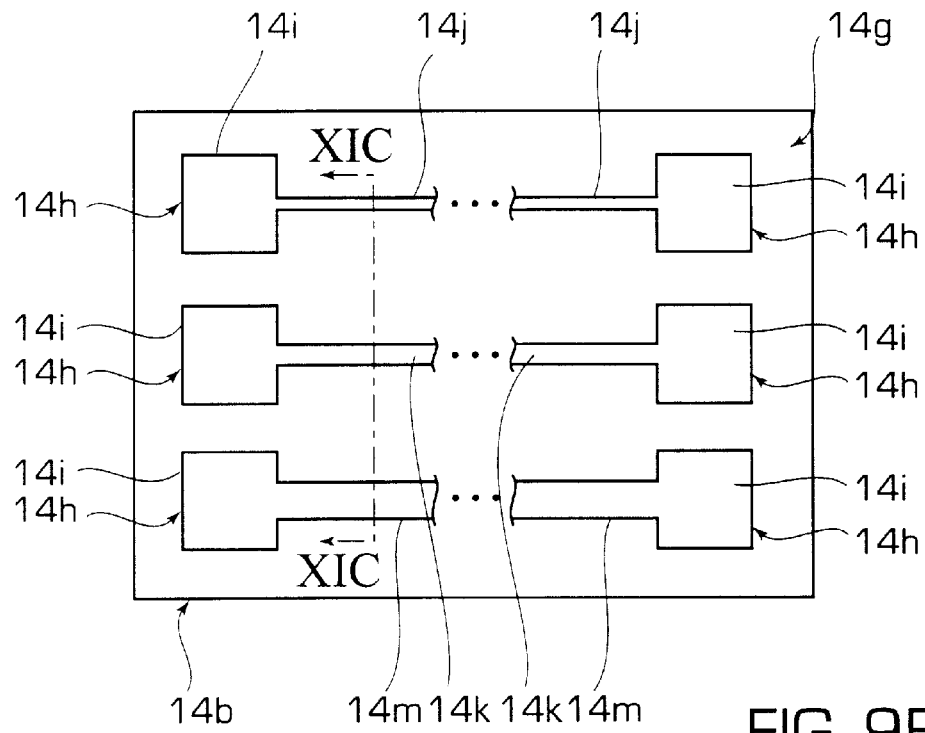
Figure 9C:
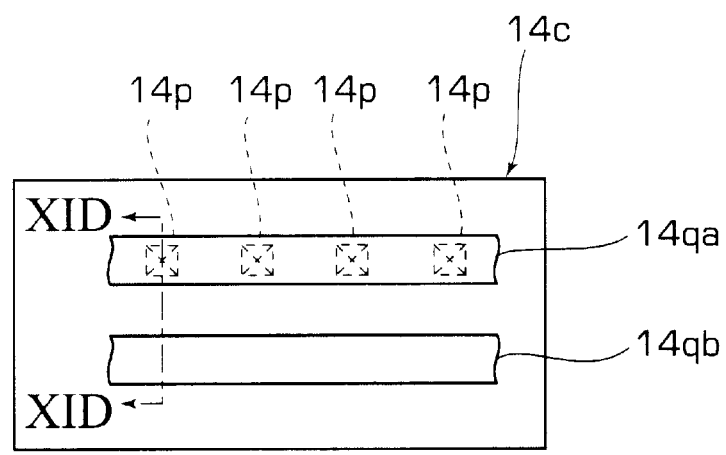

FIGS. 9A to 9C illustrate the layouts of the testing elements 14a, 14b and 14c, respectively. The manufacturer uses the testing element 14a so as to evaluate the alignment between the node contact holes 18b and the stem portions of the storage node electrodes 16b, and includes contact holes 14d marked with "x" and a pattern of polysilicon strips 14f (see FIG. 9A). The contact holes 14d are formed in an inter-level insulating layer (not shown in FIG. 9A) concurrently with the node contact holes 18b, and are spaced from each other at predetermined intervals. On the other hand, the polysilicon strips 14f are patterned from an n-type polysilicon layer concurrently with the storage node electrodes 16b.

The contact holes 14d have a width equal to the width of the storage node electrodes 16b to be designed, i.e., 0.4 micron, and the length of the contact holes 14d is much longer than the length of the storage node electrodes 16b, i.e. , 1.3 microns. The polysilicon strips 14f have a width equal to the width of the storage node electrodes 16b, and the length of the polysilicon strips 14f is equal to the length of the contact holes 14d. Therefore, a mis-alignment between the node contact holes 18b and the storage node electrodes 16b is transferred to the alignment between the contact holes 14d and the polysilicon strips 14f.

The manufacturer uses the testing element 14b so as to measure the sheet resistance of the n-type polysilicon for the storage node electrodes 16b. The testing element 14b is implemented by a polysilicon test pattern 14g as shown in FIG. 9B, and a plurality of polysilicon strips 14h form in combination the polysilicon test pattern 14g. The polysilicon strips 14h are also patterned from the n-type polysilicon layer for the storage node electrodes 16b, and are broken down into three groups. All of the polysilicon strips 14h have respective pad portions 14i of ten microns square, and the pad portions 14i are wide enough to allow a probe (not shown) to come into contact therewith. Narrow portions 14j, 14k and 14m project from the pad portions 14i, and are different in width from one another. The narrow portions 14j are equal to the width of the storage node electrodes 16b. However, the narrow portions 14k are, by way of example, twice as wide as the storage node electrodes 16b, and the narrow portions 14m are, by way of example, four times as wide as the storage node electrodes 16b. The sheet resistance is usually measured before the formation of the dielectric films on the storage node electrodes 16b.

The manufacturer checks the testing element 14c to determine whether or not the storage node electrodes 16b are short circuited. As shown in FIG. 9C, the testing element 14c has n-type impurity regions (not shown in FIG. 9C) concurrently formed together with the n-type drain and source regions 15a/15b, a plurality of contact holes 14p, which are marked with "x", formed in the inter-level insulating layer concurrently with the node contact holes 18b and a plurality of polysilicon strips 14qa, 14qb, . . . formed from the n-type polysilicon layer concurrently with the storage node electrodes 16b. The polysilicon strips 14qa and 14qb are wider than the storage node electrodes 16b, and are spaced from each other by a gap equal to that between the adjacent storage node electrodes 16b. The polysilicon strips 14qa and 14qb are much longer than the storage node electrodes 6b, and are of the order of 1 millimeter. The contact holes 14p are equal in dimensions to the note contact holes 18b. Although the polysilicon strip 14qa is electrically connected through the contact holes 14p to the n-type impurity region, no contact hole is formed beneath the polysilicon strip 14qb, because the manufacturer does not expect the testing element 14c to detect a short-circuit between the impurity regions. The manufacturer checks the testing element 14c before the deposition of the dielectric films.

Figure 10:
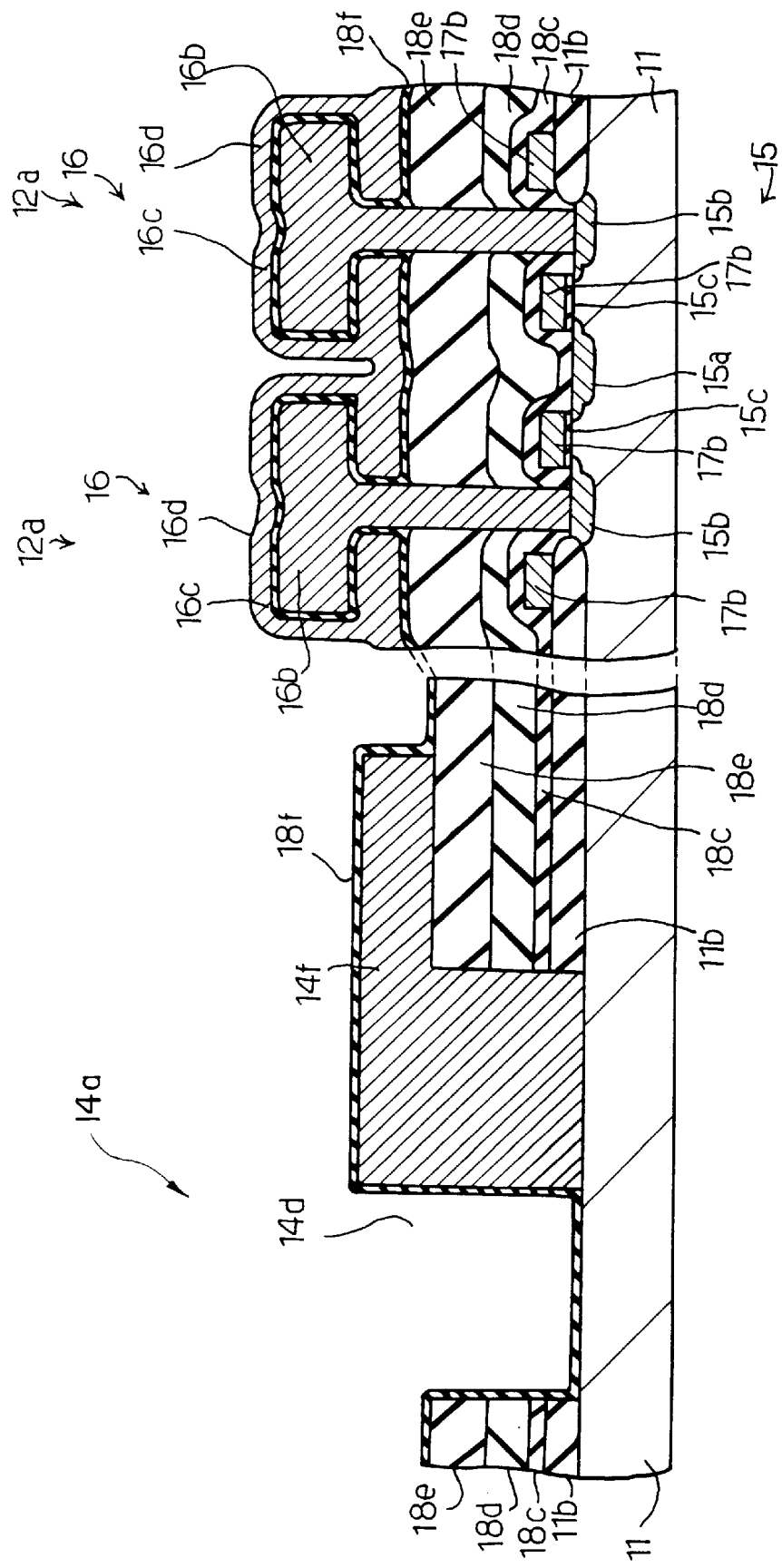
FIG. 10 is a cross sectional views taken along line X—X of FIG. 7 and showing the structure of the memory cell and the testing element.

The structure of the semiconductor device will now be described with reference to FIGS. 10 and 11A to 11D. FIG. 10 shows the cross section taken along line X—X, and the structure of the memory cell 12a and the structure of testing element 14a are seen in the cross section. Although two memory cells 12a are shown in FIG. 10, description is focused on one of the memory cells 12a; however, the components of the other memory cell 12a are labeled with the same references.

A thick field oxide layer 11b is selectively grown on the major surface of the p-type silicon substrate 11, and defines the active area assigned to the two memory cells 12a in the central area. The thick field oxide layer 11b is of the order of 300 nanometers thick.

The drain region 15a and the source region 15b have an LDD (Lightly-Doped Drain) structure, and form p-n junctions at 0.15 micron deep from the major surface of the p-type silicon substrate 11. The channel region between the source region 15b and the drain regions 15a is covered with a thin gate oxide layer 15c of 10 nanometers thick, and the word line 17b extends over the thin gate oxide layer 15c. The thin gate oxide layer 15c is overlain by the gate electrode, and the gate electrode, the thin gate oxide layer 15c, the channel region and the source region 15b and the drain region 15a as a whole constitute the switching transistor 15.

The word line 17b and, accordingly, the gate electrode have a multi-layer structure of an n-type polysilicon strip of 100 nanometers thick and a tungsten silicide strip of 100 nanometers thick.

A silicon oxide layer 18c covers the word lines 17b and exposed major surface, and is or the order of 100 nanometers thick. The silicon oxide layer 18c prevents the n-type drain region 15a and the n-type source region 15b from boron diffused from a first inter-level insulating layer 18d described hereinbelow.

The silicon oxide layer 18c is overlain by the first inter-level insulating layer 18d, and the first inter-level insulating layer 18d is formed of boro-phosphosilicate glass. The first inter-level insulating layer 18d is of the order of 300 nanometers thick, and has been reflowed.

Figure 11A:
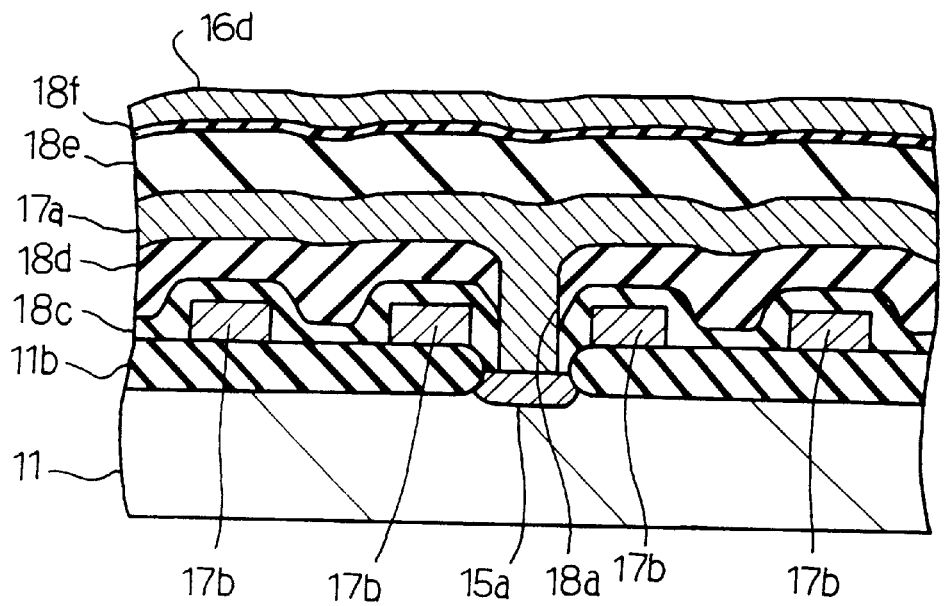
FIGS. 11A to 11D are cross sectional views taken along lines XI.A—XI.A, XI.B—XI.B, XI.C—XI.C and XI.D—XI.D of FIGS. 8, 9B and 9C and showing the structures of the testing elements.

Turning to FIG. 11A of the drawings, the bit contact hole 18a passes through the first inter-level insulating layer 18d and the silicon oxide layer 18c, and the n-type drain region 15a is exposed to the bit contact hole 18a. Although the bit contact hole 18a is designated to be 0.4 micron square, the bit contact hole 18a is as narrow as 0.2 micron square in the actual product. The bit lines 17a extend on the first inter-level insulating layer 17a, and is 0.4 micron in width. The bit lines 17a have a multi-layer structure formed from an n-type polysilicon strip of 150 nanometers thick and a tungsten silicide strip of 100 nanometers thick.

Turning back to FIG. 10 of the drawings, the first inter-level insulating layer 18d is further overlain by a second inter-level insulating layer 18e, and the second inter-level insulating layer 18e is formed from a boro-phosphosilicate glass layer of 400 nanometers thick and a silicon nitride layer of 100 nanometers thick on the boro-phosphosilicate glass layer. The boro-phosphosilicate glass layer has been reflowed. The second inter-level insulating layer 18e is covered with a dielectric film 18f concurrently deposited together with the dielectric film of the storage node electrodes 16b.

The storage capacitor 16 is formed on the second inter-level insulating layer 18e. The node contact hole 18b passes through the dielectric film 18f, the first and second inter-level insulating layers 18d/18e and the silicon oxide layer 18c, and the source region 15b is exposed to the node contact hole 18b. The node contact hole 18b is designed to be 0.4 micron square; however, the actual node contact hole 18b is 0.2 micron square.

The storage node electrodes 16b are formed of n-type polysilicon, and are 600 nanometers thick. The storage node electrode 16b is broken down into a stem and an accumulating portion, and has the fin structure. The stem passes through the node contact hole 18b, and is held in contact with the source region 15b. The accumulating portion of the storage node electrode 16b projects over the dielectric film 18f, and the gap between the accumulating portion and the second inter-level insulating layer 18e is of the order of 0.4 micron, and is narrower than the gap between the adjacent storage node electrodes 16b.

The storage node electrode 16b over the second inter-level insulating layer 18e is covered with the dielectric film 16c, and the dielectric film 16c is covered with the cell plate electrode 16d. The cell plate electrodes 16d are formed of n-type polysilicon, and are of the order of 200 nanometers thick. The gap between the dielectric films 18f and 16c is filled with the cell plate electrode 16d. The storage node electrode 16b, the dielectric film 16c and the cell plate electrode 16d form in combination the storage capacitor 16.

Figure 11B:
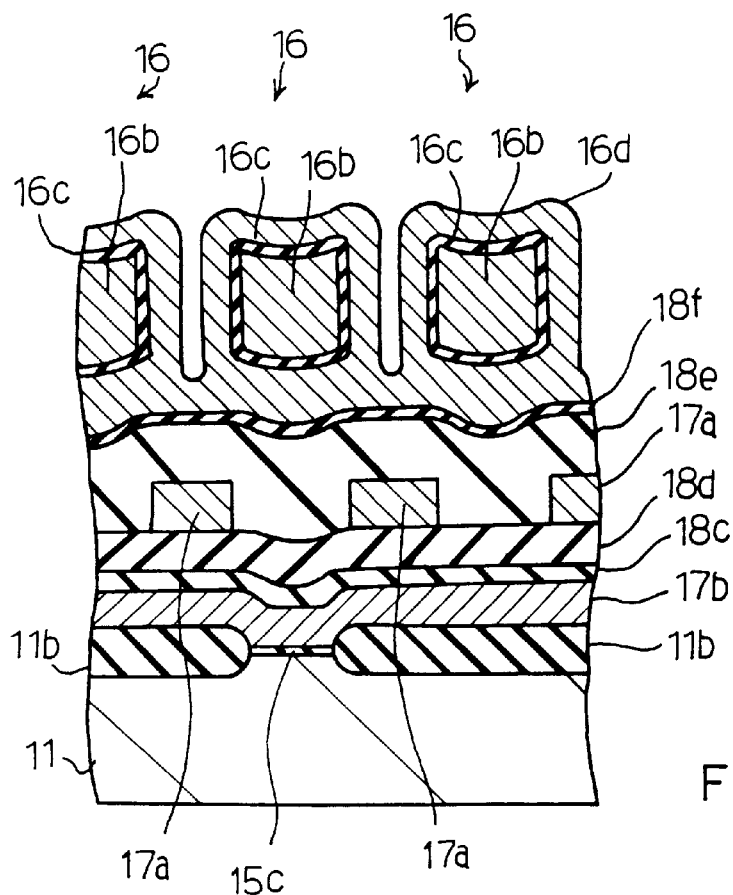

The COB structure is seen in FIG. 11B. The word line 17b extends over the thick field oxide layer 11b and the gate oxide layer 15c, and the bit lines 17a extend on the first inter-level insulating layer 18d over the word line 17b. The storage capacitors 16 are formed on the dielectric film 18f over the bit lines 17a. Thus, the bit lines 17a are formed between the switching transistors 15 and the storage capacitors 16.

Turning back to FIG. 10 of the drawings, the contact hole 14d of the testing element 14a is formed in the lamination of the silicon oxide layer 18c, the first and second inter-level insulating layers 18d/18e and the thick field oxide layer 11b, and reaches the p-type silicon substrate 11. The bottom end of the contact hole 14d may be terminated at the inside of the thick field oxide layer 11b in another embodiment.

The polysilicon strip 14f is partially provided on the second inter-level insulating layer 18e and partially in the contact hole 14d so as to be held in contact with the p-type silicon substrate 1. There is no gap between the second inter-level insulating layer 18e and the polysilicon strip 14f, and, accordingly, residual n-type polysilicon is not left between the second inter-level insulating layer 18e and the polysilicon strip 14f.

Figure 11C:
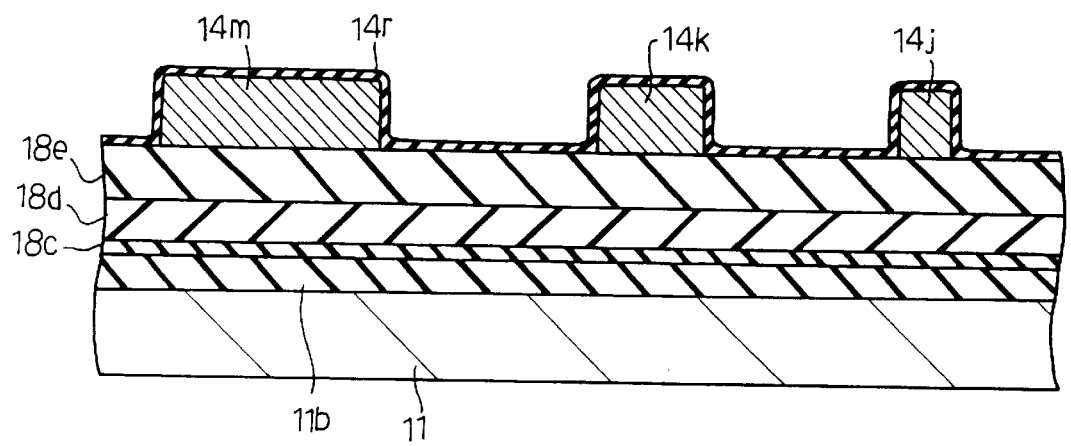

The structure of the testing element 14b is illustrated in FIG. 11C. The polysilicon strips 14j, 14k and 14m are formed on the second inter-level insulating layer 18e. Any gap does not occur between the second inter-level insulating layer 18e and the polysilicon strips 14j/14k/14m, and, accordingly, no residual phosphosilicate glass and no residual polysilicon is inserted between the second inter-level insulating layer 18e and the polysilicon strips 4j/4k/4m. The polysilicon strips 4k/4m are covered with a dielectric film 14r deposited concurrently with the dielectric film 16c.

Figure 11D:
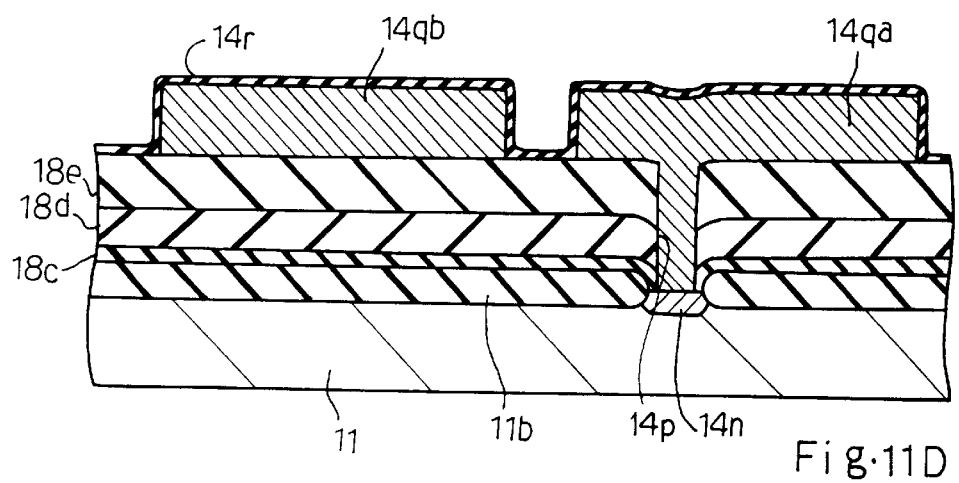

The structure of the testing element 14c is illustrated in FIG. 11D. The polysilicon strips 14qa and 14qb are directly patterned on the second inter-level insulating layer 18e, and no gap occurs between the second inter-level insulating layer 18e and the polysilicon strips 14qa/14qb. The polysilicon strips 14qa/14qb are covered with the dielectric films 14r. As described hereinbefore, the polysilicon strip 14qa is held in contact through the contact holes 14p with the n-type impurity region, and the n-type impurity region is labeled with reference 14n.

The semiconductor device according to the present invention is fabricated as follows. FIGS. 12A to 12E illustrate a process sequence, and shows the cross section taken along line XII—XII of FIG. 7.

First, the p-type silicon substrate 11 is prepared. The thick field oxide layer 11b is selectively grown to 300 nanometers thick on the major surface of the p-type silicon substrate 11 by using the LOCOS (local oxidation of silicon) technology, and defines the active area assigned to two memory cells 12a.

The active areas are thermally oxidized, and the thin gate oxide layers 15c are grown to 10 nanometers thick on the active area. N-type polysilicon is deposited to 100 nanometers thick over the entire surface of the structure, and tungsten silicide is further deposited to 100 nanometers thick over the n-type polysilicon layer. A photo-resist etching mask (not shown) is formed on the tungsten silicide layer by using lithographic techniques, and the tungsten silicide layer and the polysilicon layer are patterned into the word lines 17b. Phosphorous is ion implanted into the active area, and side wall spacers are formed on the side surfaces of the word lines 17b. Arsenic is ion implanted into the active area, and the phosphorous and the arsenic forms the n-type drain and source regions 15a/15b of the LDD structure in a self-aligned manner with the word lines 17b The n-type dopant impurities further form the n-type impurity regions 14n of the testing element 14c. In this way, the switching transistors 15 are fabricated on the p-type silicon substrate 11.

Subsequently, the semiconductor substrate 11 is placed in a reactor of a low-pressure chemical vapor deposition system (not shown), and gaseous mixture containing silane ($SiH_4$) and dinitrogen monoxide ($N_2O$) is introduced into the reactor. Then, silicon oxide is deposited to 100 nanometers thick over the entire surface of the resultant structure at 800 degrees in centigrade, and the silicon oxide forms a good step-coverage. The thick field oxide layer 11b, the word lines 17b and the n-type drain/source regions 15a/15b are covered with the silicon oxide layer 18c. The silicon oxide thus produced is hereinbelow called as "HTO".

Boro-phosphosilicate glass is deposited over the silicon oxide layer 18c, and the boro-phosphosilicate glass layer is reflowed at 750 degrees to 900 degrees in centigrade. The boro-phosphosilicate glass forms the first inter-level insulating layer 18d. The boro-phosphosilicate glass is produced by decomposing gaseous mixture of TEOS (tetraethylorthosilicate), $PH_3$), $B(OCH_3)_3$ and $O_2$ in the reactor of the low-pressure chemical vapor deposition system. The boro-phosphosilicate glass may be produced from gaseous mixture containing TEOS, $P(OCH_3)_3$, $B(OCH_3)_3$ or $B(OC_2H_5)_3$ and $O_3$ in a reactor of an atmospheric pressure chemical vapor deposition system. The first inter-level insulating layer 18d may be formed of phosphosilicate glass.

A photo-resist etching mask (not shown) is formed on the first inter-level insulating layer 18d, and the first inter-level insulating layer 18d and the silicon oxide layer 18c are selectively removed by using a reactive ion etching technique so as to form the bit contact holes 18a (not shown in FIGS. 12A to 12E). $CF_4$ is available for the reactive ion etching. Though not shown in FIG. 11A, an HTO layer is deposited over the entire surface of the structure, and the HTO layer is anisotropically etched so as to form a spacer on the inner surface defining the bit contact holes 18a.

N-type polysilicon is deposited to 150 nanometers thick over the first inter-level insulating layer. The n-type polysilicon fills the bit contact holes 18a, and swells into an n-type polysilicon layer. Tungsten silicide is further deposited to 100 nanometers thick on the n-type polysilicon layer. A photo-resist etching mask (not shown) is formed on the tungsten silicide layer, and the n-type polysilicon layer and the tungsten silicide layer are patterned into the bit lines 17a (not shown in FIGS. 12A to 12E).

Boro-phosphosilicate glass is deposited to 400 nanometers thick over the bit lines 17a on the first inter-level insulating layer 18d, and the boro-phosphosilicate glass layer is reflowed. Silicon nitride is deposited to 100 nanometers thick over the boro-phosphosilicate glass layer, and the boro-phosphosilicate glass layer and the silicon nitride layer form in combination the second inter-level insulating layer 18e. The silicon nitride is produced from gaseous mixture containing $SiH_2Cl_2$ and $NH_3$ by using a low pressure chemical vapor deposition. The silicon nitride layer may be replaced with a silicon oxide layer or an NSG layer deposited by using an atmospheric pressure chemical vapor deposition.

Figure 12A:
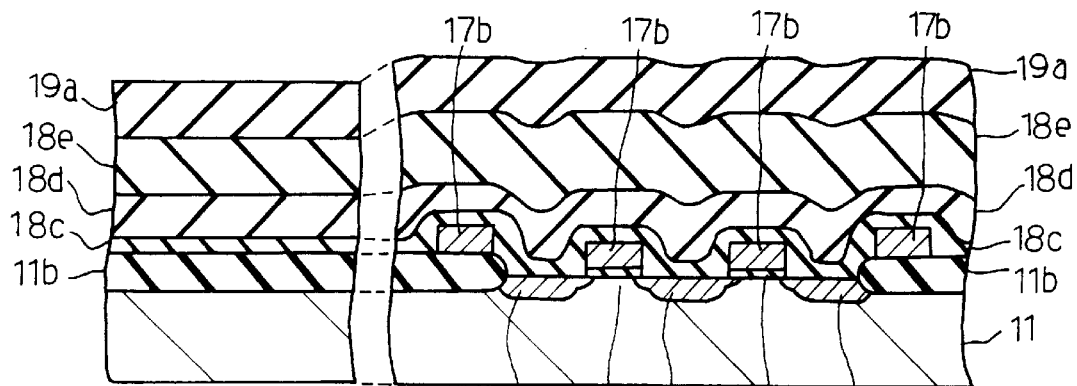
FIGS. 12A to 12E are cross sectional views showing a process sequence of fabricating the semiconductor dynamic random access memory device.

On the silicon nitride layer of the second inter-level insulating layer 18e is deposited phosphosilicate glass which forms a spacing layer 19a as shown in FIG. 12A. The spacing layer 19a is 400 nanometers thick. The spacing layer 19a may be formed of boro-phosphosilicate glass.

A photo-resist etching mask (not shown) is formed on the spacing layer 19a, and has an opening exposing the outer peripheral area. Using the photo-resist etching mask, the spacing layer 19a is selectively removed over the outer peripheral area by using etching gas containing $C_4F_8$ and CO, and the second inter-level insulating layer 18e is partially exposed. The etching gas may contain $CHF_3$ and CO. Thus, the spacing layer 19a is removed from the outer peripheral area, and still covers at least the central area assigned to the memory cell array 12. In case where the silicon layer or the NSG layer forms the upper surface of the second inter-level insulating layer 18e, the phosphosilicate glass layer 19a is selectively etched away by using buffered hydrofluoric acid. HF and $NH_4F$ are preferably regulated to 1:30.

Figure 12B:
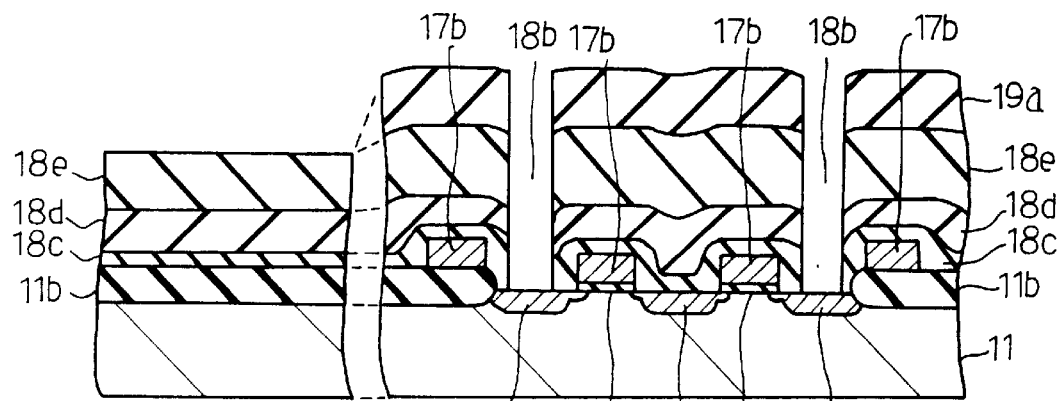

Subsequently, a photo-resist etching mask (not shown) is provided for the node contact holes 18b, the contact holes 14d and the contact holes 14p, and has openings over the n-type source regions 15b and the outer peripheral area. Using the photo-resist etching mask, the spacer layer 19a, the second inter-level insulating layer 18e, the first inter-level insulating layer 18d and the silicon oxide layer 18c are selectively etched a way so as to for m the node contact holes 18b as shown in FIG. 12B, and the n-type source regions 15b are exposed to the node contact holes 18b. The photo-resist etching mask further allows the etchant to remove the first and second inter-level insulating layers 18d/18e, the silicon oxide layer 18c and the thick field oxide layer 11b so as to form the contact holes 14d of the testing element 14a and to remove the first and second inter-level insulating layers 18d/18e and the silicon oxide layer 18c for forming the contact holes 18p of the testing elements 14c. The p-type silicon substrate 11 is exposed to the contact holes 14d, and the n-type impurity region 14n is exposed to the contact holes 14p. Side wall spacers are formed on the inner surfaces defining the node contact holes 18b, the contact holes 14d and the contact holes 14p as similar to the bit contact holes 18a.

Figure 12C:
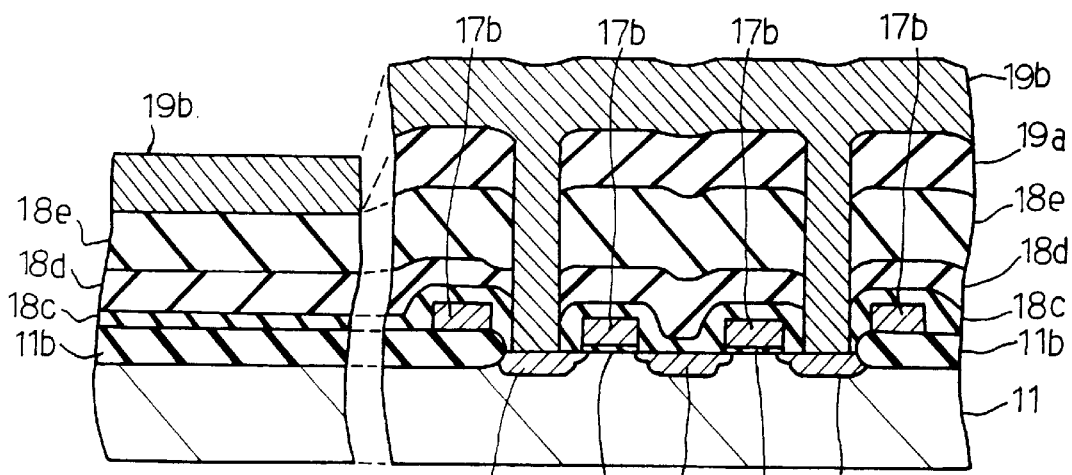

Subsequently, the p-type silicon substrate 11 is placed in a reactor of a low-pressure chemical vapor deposition system, and gaseous mixture containing silane/disilane and phosphine is introduced into the reactor. N-type polysilicon is deposited over the entire surface of the spacing layer 19a over the at least central area and the second inter-level insulating layer 18e over the outer peripheral area, and the dopant concentration of the n-type polysilicon is of the order of $1.5 \times 10^{20}$ cm.$^{-3}$. The n-type polysilicon fills the node contact holes 18b and the contact holes 14d/14p, and swells into an n-type polysilicon layer 19b of 600 nanometers thick as shown in FIG. 12C.

Amorphous silicon may be deposited, and n-type dopant impurity may be introduced into the amorphous silicon through in-situ doping. In this instance, it is advantageous to covert the amorphous silicon to polysilicon before a deposition of the dielectric film 16c, because the sheet resistance is too high.

Figure 12D:
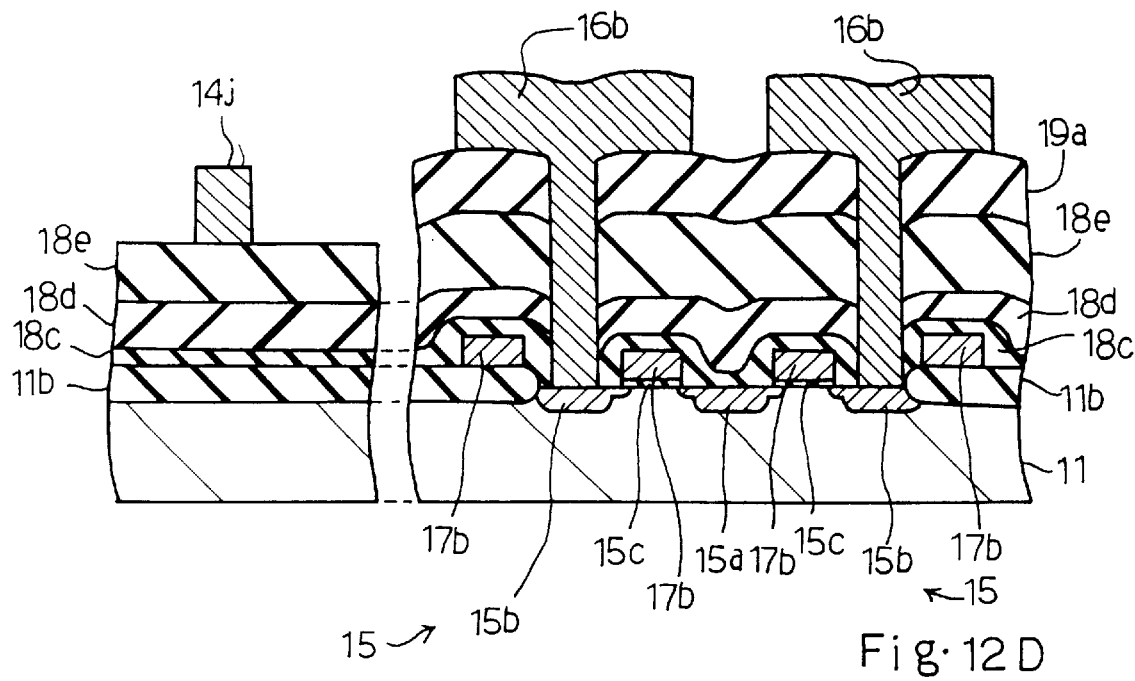

A photo-resist etching mask (not shown) is formed on the n-type polysilicon layer 19b, and selectively exposes the n-type polysilicon layer 19b to gaseous etchant of a reactive ion etching such as, for example, HBr. Thus, the n-type polysilicon layer 19b is patterned into the storage node electrodes 16b and the polysilicon strips 14f, 14h, 14qa and 14qb as shown in FIG. 12D.

Figure 12E:
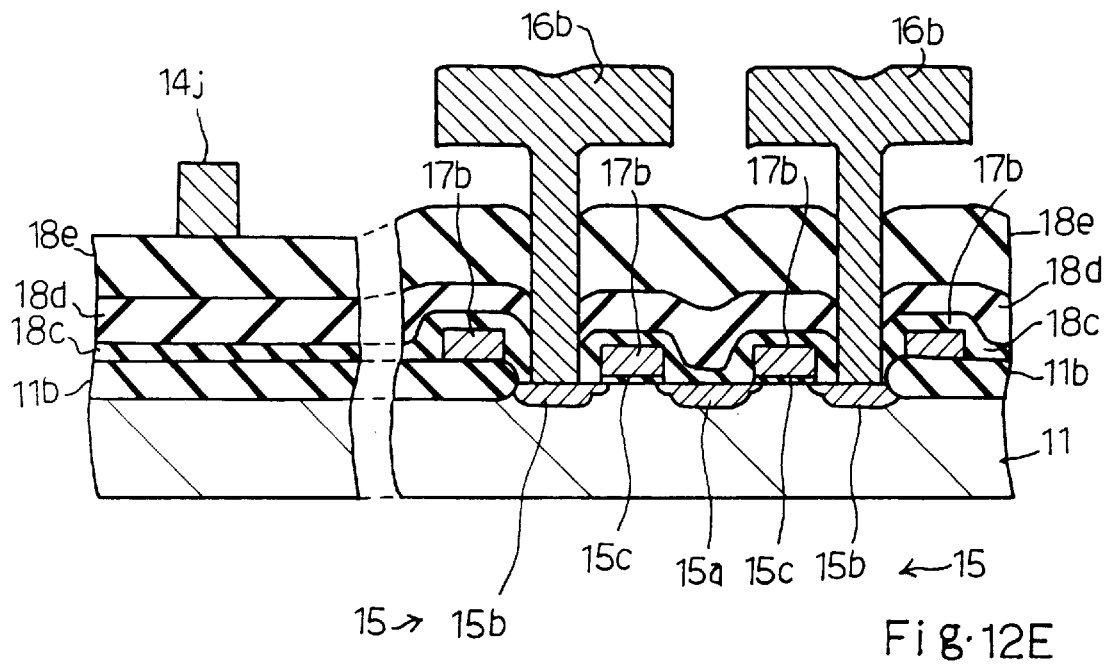

Using dilute hydrofluoric acid, the spacing layer 19a is isotropically etched away, and a gap takes place between the storage node electrodes 16b and the second inter-level insulating layer 18e. The polysilicon strips 14f, 14h, 14qa and 14qb are directly formed on the second inter-level insulating layer 18e as shown in FIG. 12E, and no gap takes place under the polysilicon strips 14f, 14h, 14qa and 14qb (see FIGS. 10, 11C, 11D and 12E).

The dielectric films 16c, 18f and 14r cover the storage node electrodes 16b, the second inter-level insulating layer 18e and the polysilicon strips 14f, 14h, 14qa, 14qb. In this instance, silicon nitride is deposited to 7 nanometers thick over the entire surface of the structure, and a surface portion of the silicon nitride layer is converted to silicon oxide by using pyrogenic oxidation in wet ambience at 800 degrees in centigrade. Thus, the dielectric film is implemented by the lamination of silicon nitride layer and silicon oxide layer, and is equivalent to a silicon oxide film of 5 nanometers thick.

Finally, n-type polysilicon is deposited to 200 nanometers thick over the entire surface of the structure as similar to the n-type polysilicon for the storage node electrodes 16b, and the n-type polysilicon layer is patterned into the cell plate electrodes 16d. The storage node electrode 16b, the dielectric film 16c and the cell plate electrode 16d as a whole constitute the storage capacitor 16.

Thereafter, steps well know to a person skilled in the art are carried out, and the semiconductor device is completed.

As will be appreciated from the foregoing description, the polysilicon strips 14d, 14h, 14qa and 14qb are directly held in contact with the second inter-level insulating layer 18e, and are never broken nor chipped off during the patterning step of the n-type polysilicon layer 19b. For this reason, the manufacturer can evaluate the properties of the storage node electrode 16b, and the semiconductor device is improved in reliability. Moreover, any broken polysilicon piece does not short circuit the storage node electrodes 16b, and the production yield is enhanced.

In this instance, the silicon oxide layer 18c, the first inter-level insulating layer 18d and the second inter-level insulating layer 18e as a whole constitute an inter-level insulating structure, and the storage node electrode 16b of the storage capacitor 16 serves as a first member of at least one circuit component. One of the polysilicon strips 14d/14h/14qa/14qb serves as at least one second member. The n-type polysilicon layer 19b serves as a first layer.

Figure 13A:
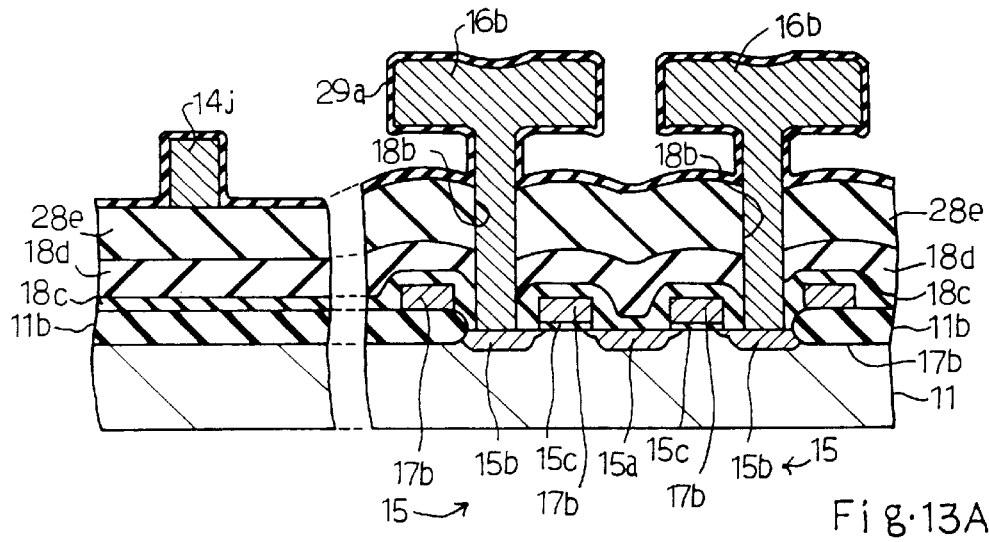
FIGS. 13A to 13C are cross sectional view showing another process sequence of fabricating the semiconductor dynamic random access memory device.
Figure 13B:
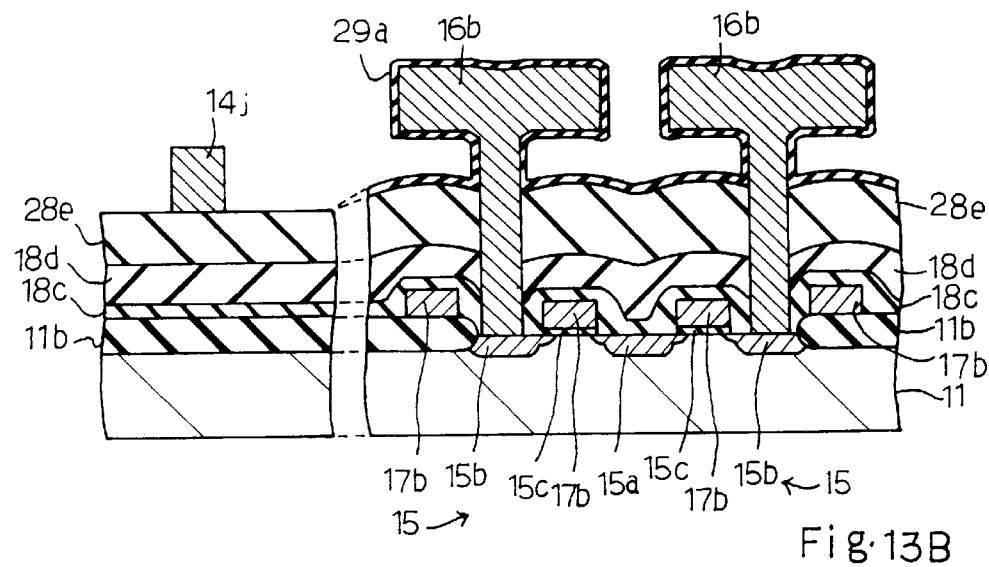
Figure 13C:
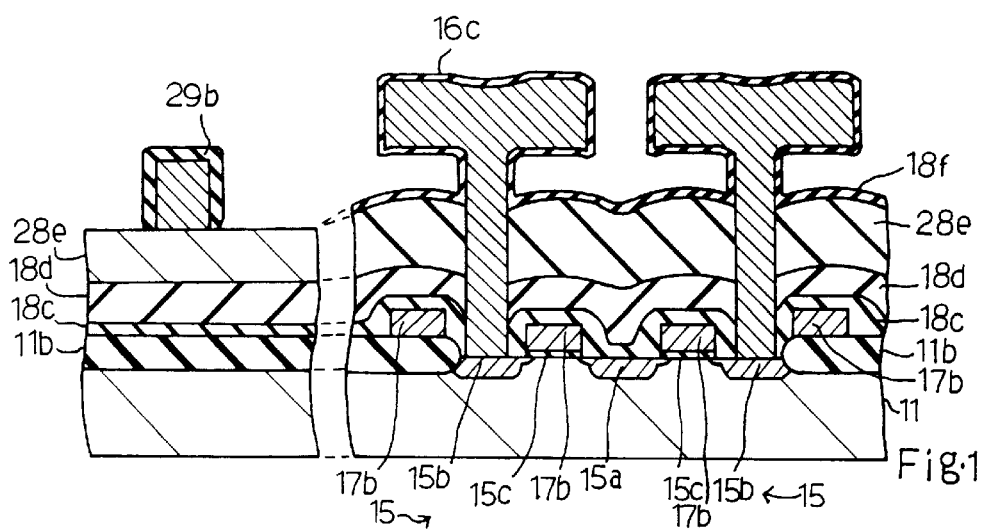
Figure 14:
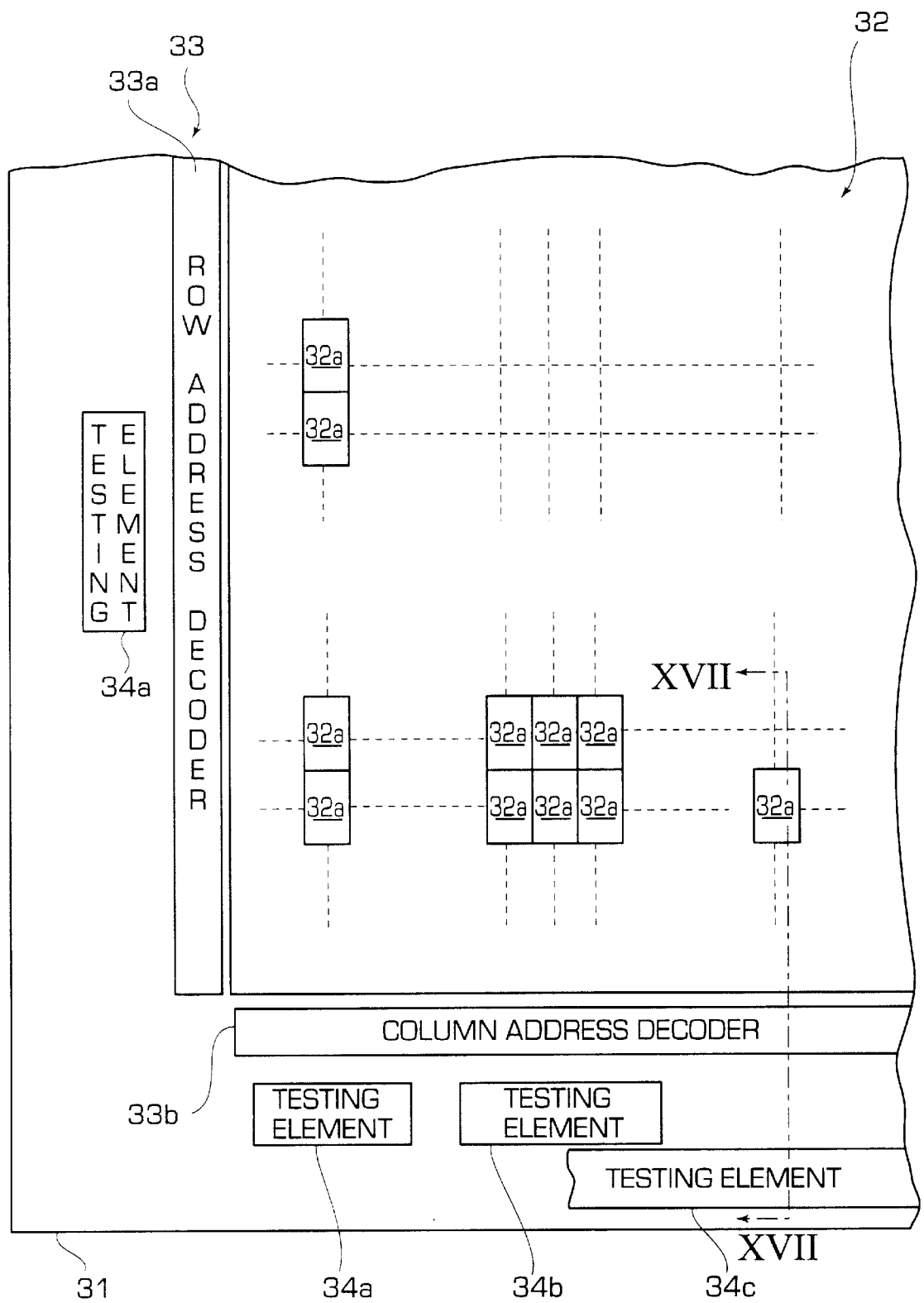
FIG. 14 is a plan view showing the layout of another semiconductor dynamic random access memory device according to the present invention.

The process sequence described hereinbefore may be modified as follows. FIGS. 13A to 13C illustrates another process of fabricating the semiconductor device shown in FIGS. 10 and 11A to 11D. The modified process sequence is similar to that of the process shown in FIGS. 12A to 12E until the formation of the bit lines 17a. For this reason, layers, regions and contact holes in the modified process are labeled with the references designating the corresponding layers, regions and contact holes of the structure shown in FIGS. 12A to 12E without detailed description for avoiding repetition.

Upon completion of the bit lines 17a, the phosphosilicate glass is deposited over the bit lines 17a and the first-inter-level insulating layer 18d, and silicon oxide is deposited over the phosphosilicate glass layer for forming the NSG layer. The phosphosilicate glass layer and the NSG layer form in combination the second inter-level insulating layer 28e. The second inter-level insulating layer 28e is overlain by a spacing layer (not shown in FIGS. 13A to 13C) corresponding to the spacing layer 19a.

The spacing layer is etched away from the second inter-level insulating layer over at least the outer peripheral area, and the spacing layer remains on the second inter-level insulating layer 28e over at least the central area. The node contact holes 18b and the contact holes 14d and 14p (not shown in FIGS. 13A to 13C) are formed as similar to the process described hereinbefore, and polysilicon is deposited over the second inter-level insulating layer 28e. The polysilicon fills the node contact holes 18b and the contact holes 14d/14p, and swells into the polysilicon layer. The polysilicon layer is patterned into the storage node electrodes 16b and the polysilicon strips 14d/14h/14qa/14qb. Silicon nitride is deposited to 7 nanometers thick over the entire surface of the structure, and a silicon nitride layer 29a topographically extends over the surfaces of the storage node electrodes 16b and the second inter-level insulating layer 28e as shown in FIG. 13A.

A photo-resist etching mask (not shown) is provided over the silicon nitride layer 29a, and exposes the silicon nitride layer 29a over the outer peripheral area to etching gas containing $CF_4$ and $O_2$ for a reactive ion etching. Then, the silicon nitride layer 29a over the outer peripheral area is etched away, and the second inter-level insulating layer 28e over the outer peripheral area is exposed again as shown in FIG. 13B. However, the silicon nitride layer 29a still covers the sources of the storage node electrodes 16b and the second inter-level insulating layer 28e over the at least central area.

The silicon nitride layer 29a and the polysilicon strips 14d/14h/14qa/14qb are subjected to the pyrogenic oxidation. The silicon nitride layer 29a and the silicon oxide form in combination the dielectric film 16c, and the polysilicon strips 14d/14h/14qa/14qb are covered with silicon oxide layers 29b of at least 10 nanometers thick as shown in FIG. 13C.

The modified process achieves all the advantages of the process implementing the first embodiment. The modified process is advantageous in wide selection of etching conditions for the cell plate electrode 16d, because the polysilicon strips 14d/14h/14qa/14qb are covered with the silicon oxide layers thicker than that of the dielectric film 16c.

Second Embodiment

FIGS. 14, 15 and 16A to 16C illustrate another semiconductor device embodying the present invention. The semiconductor device is fabricated on a p-type silicon substrate 31, and largely comprises a dynamic random access memory and a testing facility as similar to the first embodiment.

The dynamic random access memory device includes a memory cell array 32 and peripheral circuits 33, and a central area, an inner peripheral area and an outer peripheral area are respectively assigned to the memory cell array 32, the peripheral circuits 33 and the testing facility 34. The memory cell array 32 is implemented by a plurality of memory cells 32a arranged in rows and columns, and a row address decoder 33a and a column address decoder 33b are examples of the peripheral circuit 33. The testing facility includes testing elements 34a, 34b and 34c, and the testing elements 34a to 34c correspond to the testing elements 14a to 14c, respectively. For this reason, no further description is made on the testing elements 34a to 34c, and the components of the testing elements 34a to 34c are hereinbelow labeled with the references designating the corresponding components of the testing elements 14a to 14c for the sake of simplicity.

A series combination of an n-channel enhancement type switching transistor 35 and a stacked storage capacitor 36 serves as the memory cell 32a. The stacked storage capacitor 36 is different in structure from the stacked storage capacitor 16 as will be described hereinlater.

Figure 15:
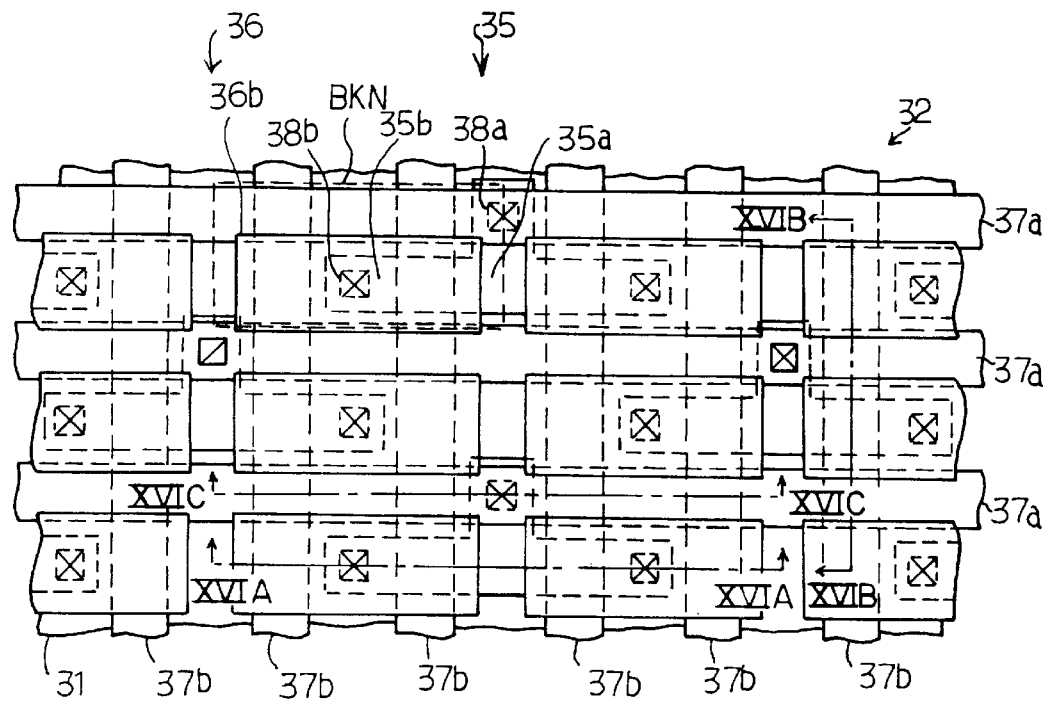
FIG. 15 is a plan view showing the layout of a memory cell array incorporated in the semiconductor dynamic random access memory device.

As shown in FIG. 15, the layout of the memory cell array 32 is similar to the memory cell array 12, and one of the memory cells 32a is enclosed with broken line BKN. Bit lines, word lines, an n-type drain region, an n-type source region, a storage node electrode, a bit contact hole and a node contact hole are labeled with 37a, 37b, 35a, 35b, 36b, 38a and 38b, respectively. The memory cell 32a is equal in size to the memory cell 12a, and measures 0.9 micron in width and 1.8 microns in length.

Figure 16A:
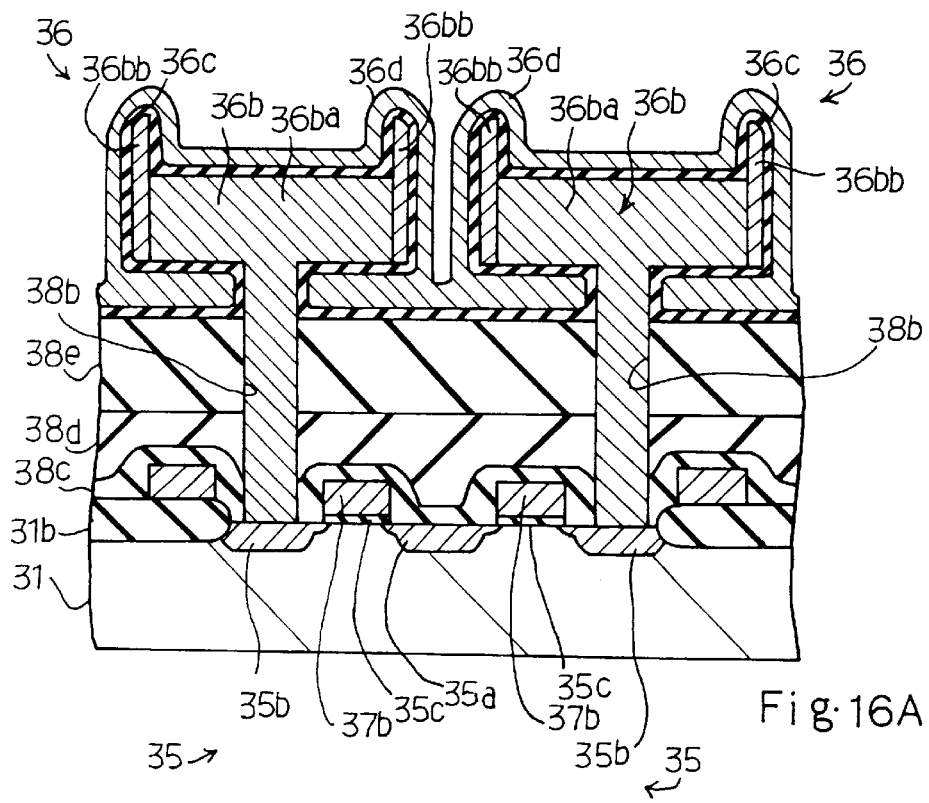
FIGS. 16A to 16C are cross sectional views taken along lines XVI.A—XVI.A, XVI.C—XVI.C and XVI.B—XVI.B of FIG. 15 and showing the structure of the semiconductor dynamic random access memory device.
Figure 16B:
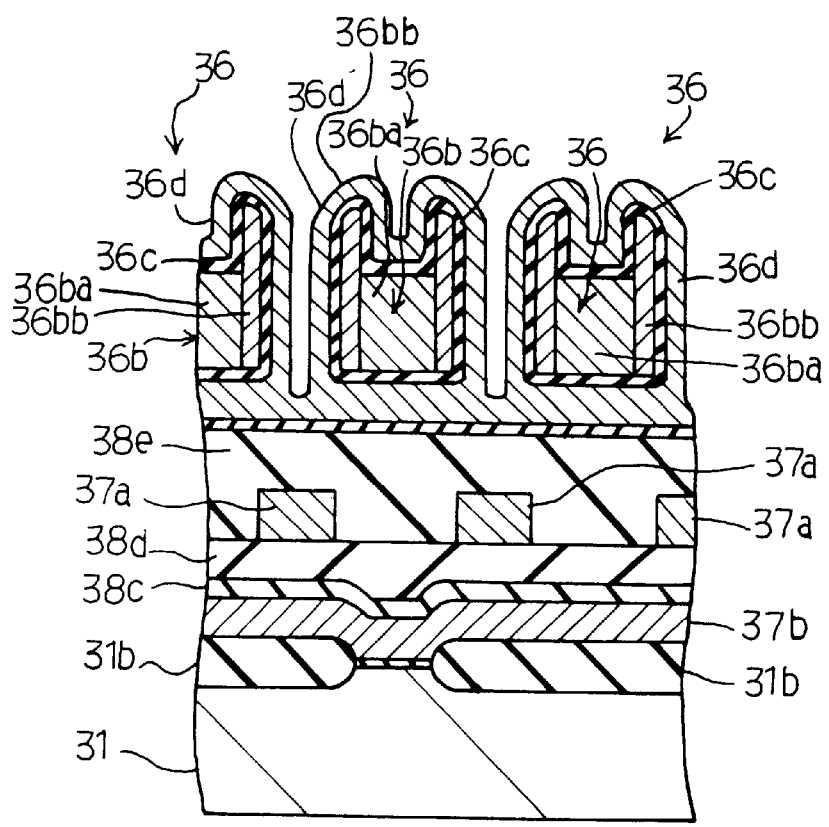

The structure of the memory cell 32a and the structure of an inter-level insulating structure are shown in FIG. 16A. Two memory cells 32a are assigned an active area defined by a thick field oxide layer 31b selectively grown on the major surface of the p-type silicon substrate 31. A thin gate insulating layer 35c of 10 nanometers thick covers a channel region between the n-type drain region 35a and the n-type drain region 35b, and the n-type drain region 35a and the n-type drain region 35b have the LDD structure. The n-type drain region 35a and the n-type source region 35b form p-n junctions around 0.15 micron in depth.

The thin gate insulating layer 35c is overlain by a part of the word line 37b, and the part of the word line 37b serve as a gate electrode of the n-channel enhancement type switching transistor 35. The gate electrode is 0.4 micron in gate length and 0.5 micron in gate width. The word line 37b has a laminated structure of an n-type polysilicon strip of 100 nanometers thick and a tungsten silicide strip of 100 nanometers thick.

The n-channel enhancement type switching transistors 35 are covered with a silicon oxide layer 38c of 100 nanometers thick, and the silicon oxide layer 38c in turn is covered with a first inter-level insulating layer 38d. A flat surface is created on the first inter-level insulating layer 38d through a chemical mechanical polishing.

Figure 16C:
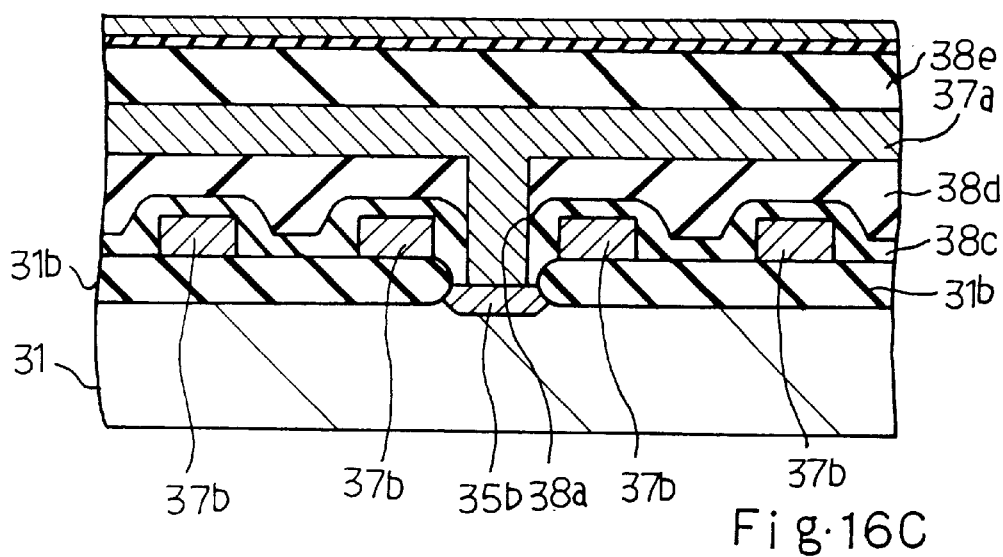

The bit lines 37a extend on the first inter-level insulating layer 38d in a perpendicular direction to the word line 37b (see FIG. 16B), and passes through the bit contact hole 38a formed in the first inter-level insulating layer 38d and the silicon oxide layer 38c so as to be held in contact with the n-type drain region 35b (see FIG. 16C). The bit contact hole 38a is 0.2 micron square, and the bit line is 0.4 micron in width. An n-type polysilicon strip of 150 nanometers thick is overlain by a tungsten silicide strip of 100 nanometers thick, and the n-type polysilicon strip and the tungsten silicide strip form in combination the bit line 37a.

The bit lines 37a and the first inter-level insulating layer 38d are covered with a second inter-level insulating layer 38e. The second inter-level insulating layer 38e is formed of boro-phosphosilicate glass or phosphosilicate glass, and is of the order of 600 nanometers thick. The boro-phosphosilicate glass layer or the phosphosilicate glass layer was reflowed, and was subjected to the chemical mechanical polishing so as to create a flat surface. The flat surface is covered with a silicon nitride layer of 100 nanometers thick, and the boro-phosphosilicate glass layer/phosphosilicate glass layer and the silicon nitride layer form in combination the second inter-level insulating layer 38e. The silicon nitride layer may be replaced with a silicon oxide layer or an NSG layer.

The stacked storage capacitors 36 are fabricated on the second inter-level insulating layer 38e, and are electrically connected through the node contact holes 38b to the n-type source regions 35b, respectively. The node contact holes 38b are 0.2 micron square.

The stacked storage capacitor 16 includes the fin storage node electrode 36b, a dielectric film 36c and a cell plate electrode 36d. An n-type polysilicon strip 36ba and an n-type polysilicon spacer 36bb attached to the side surface of the n-type polysilicon strip 36ba form in combination the fin storage node electrode 36b. The n-type polysilicon strip 36ba is of the order of 600 nanometers thick, and the n-type polysilicon spacer 36bb is 100 nanometers in width and 900 nanometers in height. Thus, the n-type polysilicon spacer 36bb projects over the upper surface of the n-type polysilicon strip 36ba.

The fin storage node electrode 36b occupies an area of 0.6 micron by 1.5 microns, and adjacent two storage node electrodes 36b are spaced from each other by 0.3 micron. The distance between the adjacent storage node electrodes 36b is narrower than that of the first embodiment. The bottom surface of the fin storage node electrode 36b is spaced from the upper surface of the second inter-level insulating layer 38e by 0.2 micron, and is narrower than the gap between the adjacent two fin storage node electrodes 36b. The dielectric film 36c and the cell plate electrode 36d fills the gap between the bottom surface of the fin storage node electrode 36b and the upper surface of the second inter-level insulating layer 38e.

The dielectric film 36c perfectly covers all the surface of the n-type polysilicon strip 36ba and all the surface of the n-type polysilicon side spacer 36bb over the second inter-level insulating layer 38e, and the cell plate electrode 36d is held in contact with all the surface of the dielectric film 36c. The cell plate electrode 36d is formed of n-type polysilicon layer of 100 nanometers thick.

Subsequently, fabricating the semiconductor device is described with reference to FIGS. 17A to 17F. FIGS. 17A to 17F illustrate the cross section taken along line XVII—XVII of FIG. 14.

The process starts with preparation of a p-type silicon substrate 31. The thick field oxide layer 31b is selectively grown to 300 nanometers thick on the major surface of the p-type silicon substrate 11 by using the LOCOS technology, and defines the active area assigned to two memory cells 32a.

The active areas are thermally oxidized, and the thin gate insulating layers 35c are grown to 10 nanometers thick on the active area. N-type polysilicon is deposited to 100 nanometers thick over the entire surface of the structure, and tungsten silicide is further deposited to 100 nanometers thick over the n-type polysilicon layer. A photo-resist etching mask (not shown) is formed on the tungsten sulicide layer by using the lithographic techniques, and the tungsten silicide layer and the n-type polysilicon layer are patterned into the word lines 37b. N-type dopant impurities are ion implanted into the active area so as to form the n-type drain regions 35a of the LDD structure and the n-type source regions 35b of the LDD structure in a self-aligned manner with the word lines 37b. The n-type dopant impurities further form n-type impurity regions 14n of the testing element 34c. In this way, the n-channel enhancement type switching transistors 35 are fabricated on the p-type silicon substrate 31.

Subsequently, silicon oxide is deposited to 100 nanometers thick over the entire surface of the resultant structure, and the silicon oxide forms the silicon oxide layer or an HTO layer 38c. The thick field oxide layer 31b, the word lines 37b and the n-type drain/source regions 35a/35b are covered with the silicon oxide layer 38c.

Boro-phosphosilicate glass or phosphosilicate glass is deposited to 600 nanometers thick over the silicon oxide layer 38c. The boro-phosphosilicate glass layer/phosphosilicate glass layer is reflowed, and chemically mechanically polished. The boro-phosphosilicate glass or phosphosilicate glass forms the first inter-level insulating layer 38d. The first inter-level insulating layer 38d is minimized over the word line 37b on the thick field oxide layer 31b, and the thinnest first inter-level insulating layer 38d is of the order of 250 nanometers thick. On the other hand, the first inter-level insulating layer 38d is maximized over the n-type drain region 35a and the n-type source region 35b, and is of the order of 600 nanometers thick. The first inter-level insulating layer 38d is not limited to the boro-phosphosilicate glass and the phosphosilicate glass, and other technologies are available for the first inter-level insulating layer 38d. For example, an NSG layer may be deposited over the boro-phosphosilicate glass layer or the phosphosilicate glass layer after the reflow, and may be chemically mechanically polished. Another alternative inter-level insulating layer may be formed of the NSG layer chemically mechanically polished.

A photo-resist etching mask (not shown) is formed on the first inter-level insulating layer 38d, and the first inter-level insulating layer 38d and the silicon oxide layer 38c are selectively etched away so as to form the bit contact holes 38a (not shown in FIGS. 17A to 17E).

N-type polysilicon is deposited over the first inter-level insulating layer 38d. The n-type polysilicon fills the bit contact holes 38a, and swells into an n-type polysilicon layer of 150 nanometers thick. Tungsten silicide is further deposited to 100 nanometers thick on the n-type polysilicon layer. A photo-resist etching mask (not shown) is formed on the tungsten silicide layer, and the n-type polysilicon layer and the tungsten silicide layer are patterned into the bit lines 37a (not shown in FIGS. 17A to 17F).

Boro-phosphosilicate glass or phosphosilicate glass is deposited to 600 nanometers thick over the bit lines 37a on the first inter-level insulating layer 38d. The boro-phosphosilicate glass/phosphosilicate glass layer is reflowed, and is chemically mechanically polished. Silicon nitride is deposited to 100 nanometers thick over the boro-phosphosilicate glass/phosphosilicate glass layer, and the boro-phosphosilicate glass/phosphosilicate glass layer and the silicon nitride layer form in combination the second inter-level insulating layer 38e. The second inter-level insulating layer 38e over the bit lines 37a is of the order of 400 nanometers thick, and is of the order of 650 nanometers thick on both sides of the bit lines 37a. The second inter-level insulating layer 38e is not limited to the materials and the deposition/flattening technologies described above. For example, an HTO layer is deposited to 100 nanometers thick, an NSG layer is further deposited to 500 nanometers thick, and the NSG layer is chemically mechanically polished, and a silicon nitride layer/NSG layer is deposited to 100 nanometers thick.

Figure 17A:
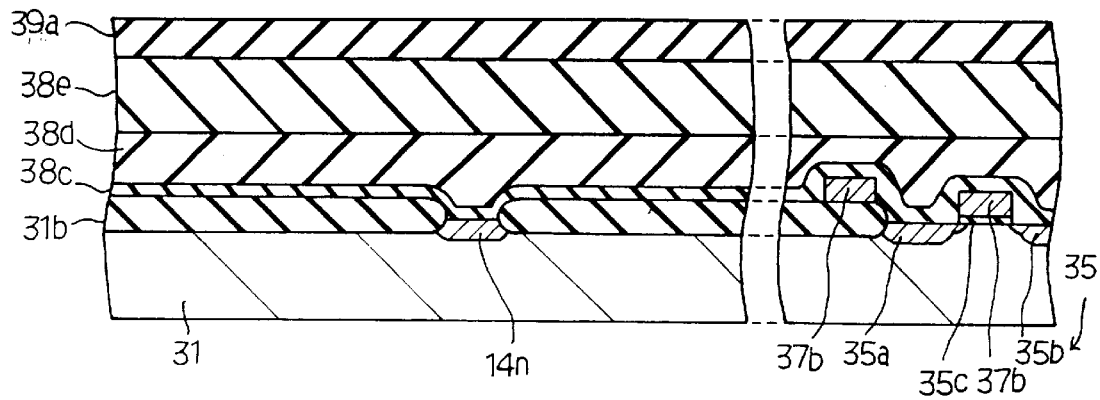
FIGS. 17A to 17F are cross sectional views taken along line XVII—XVII of FIG. 14 and showing a process of fabricating the semiconductor dynamic random access memory device.

On the silicon nitride layer of the second inter-level insulating layer 38e is deposited phosphosilicate glass which forms a first spacing layer 39a as shown in FIG. 17A. The first spacing layer 39a is 200 nanometers thick. The first spacing layer 39a may be formed of boro-phosphosilicate glass.

A photo-resist etching mask (not shown) is formed on the first spacing layer 39a, and has an opening exposing the outer peripheral area. Using the photo-resist etching mask, the first spacing layer 39a is selectively removed over the outer peripheral area by using the etching technique, and the second inter-level insulating layer 38e is partially exposed. Thus, the first spacing layer 39a is removed from the outer peripheral area, and still covers at least the central area assigned to the memory cell array 32.

Figure 17B:
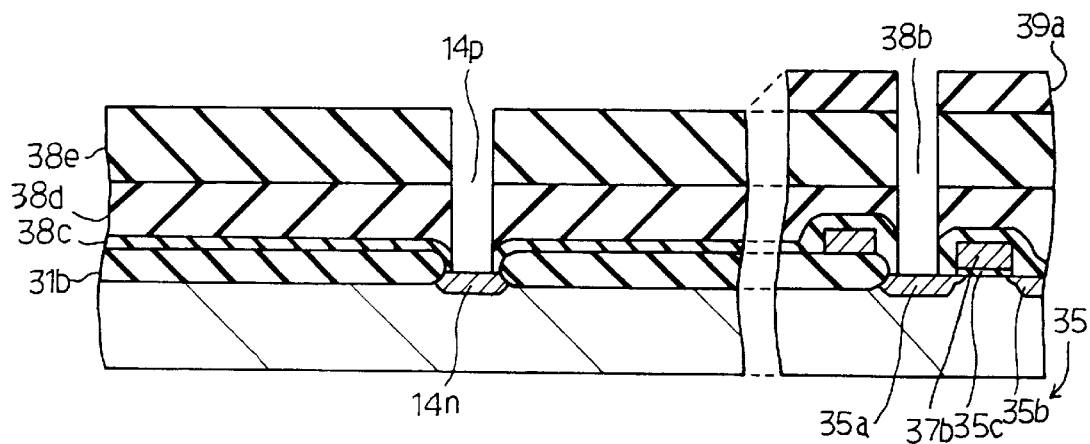

Subsequently, a photo-resist etching mask (not shown) is provided for the node contact holes 38b, the contact holes 14d and the contact holes 14p, and has openings over the n-type source regions 35 and the outer peripheral area. Using the photo-resist etching mask, the first spacer layer 39a, the second inter-level insulating layer 38e, the first inter-level insulating layer 38d and the silicon oxide layer 38c are selectively etched away so as to form the node contact holes 38b as shown in FIG. 17B, and the n-type source regions 35b are exposed to the node contact holes 38b. The photo-resist etching mask further allows the etchant to remove the first and second inter-level insulating layers 38d/38e, the silicon oxide layer 38c and the thick field oxide layer 31b so as to form the contact holes 14d of the testing element 34a and to remove the first and second inter-level insulating layers 38d/38e and the silicon oxide layer 38c for forming the contact holes 18p of the testing elements 34c. The p-type silicon substrate 31 is exposed to the contact holes 14d, and the n-type impurity region 14n is exposed to the contact holes 14p.

Figure 17C:
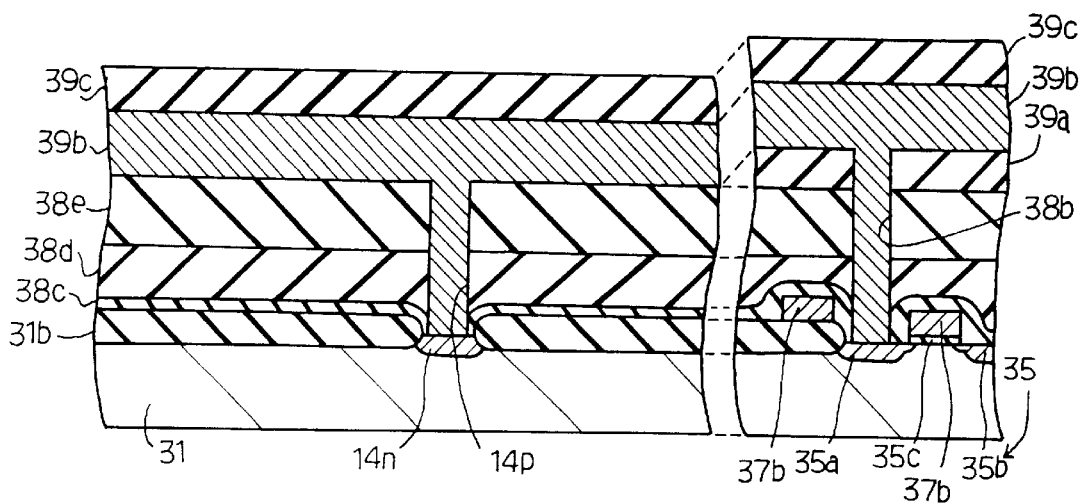

Subsequently, n-type polysilicon is deposited over the upper surface of the first spacing layer 39a over the at least central area and the second inter-level insulating layer 38e over the outer peripheral area. The n-type polysilicon fills the node contact holes 38b and the contact holes 14d/14p, and swells into an n-type polysilicon layer 39b of 600 nanometers thick. Phosphosilicate glass or boro-phosphosilicate glass is deposited to 300 nanometers thick over the n-type polysilicon layer, and forms a second spacing layer 39c as shown in FIG. 17C.

Figure 17D:
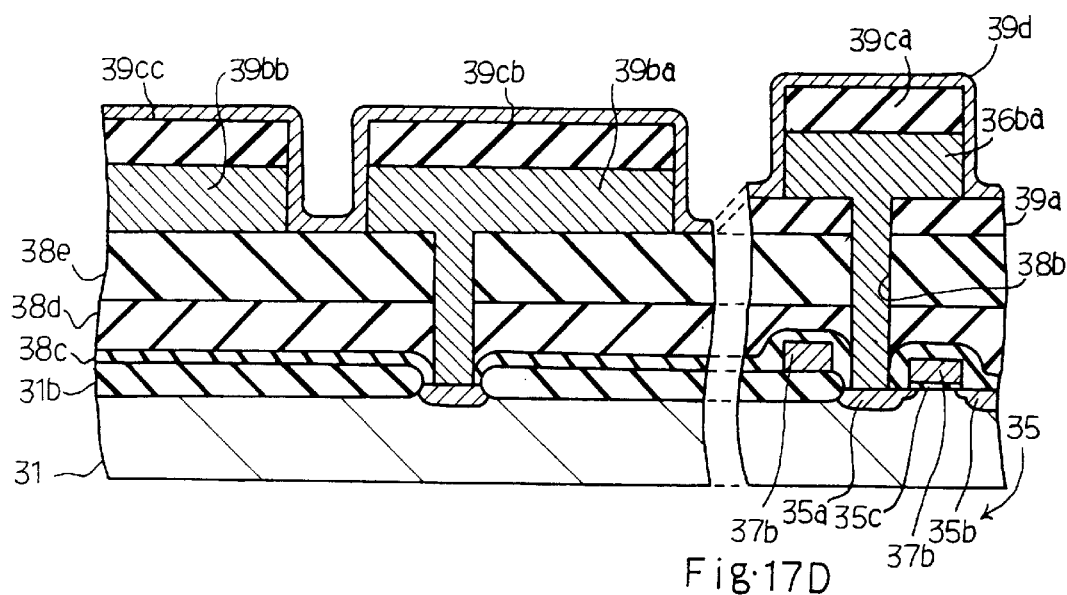

A photo-resist etching mask (not shown) is formed on the second spacing layer 39c, and selectively exposes the second spacing layer 39c and the n-type polysilicon layer 39b to anisotropic etchants. The etchants pattern the second spacing layer 39c and the n-type polysilicon layer 39b into the polysilicon strips 36ba, 39ba, 39bb . . . and spacing strips 39ca, 39cb, 39cc . . . N-type polysilicon is deposited to 100 nanometers thick over the entire surface of the structure, and the polysilicon strips 39ba/39bb/39bc . . . and the spacing strips 39ca/39cb/39cc . . . are covered with the n-type polysilicon layer 39d as shown in FIG. 17D.

Figure 17E:
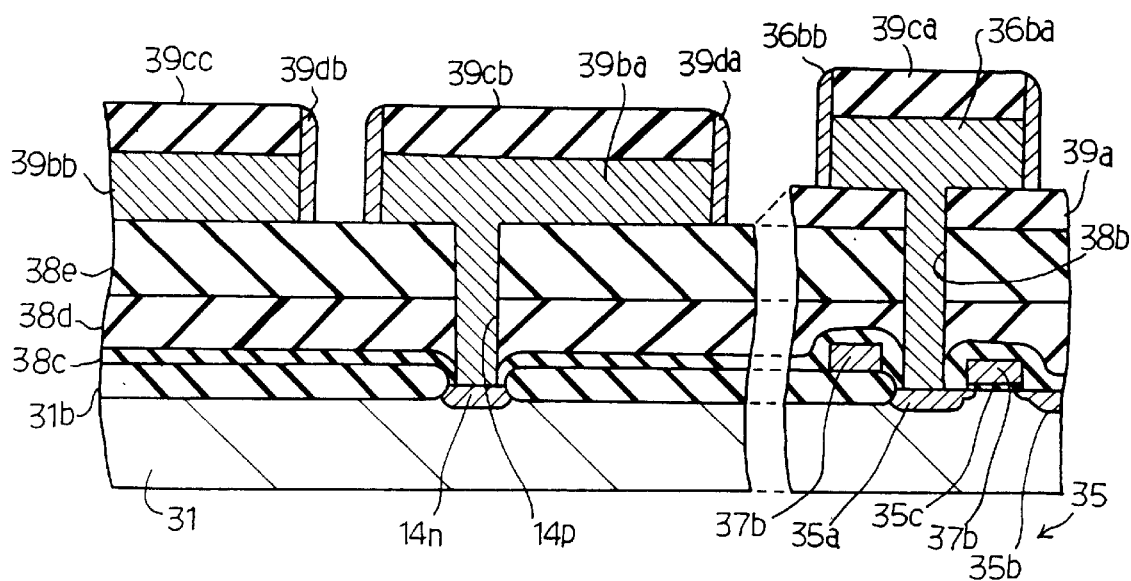

Subsequently, the n-type polysilicon layer 39d is exposed to the etchant of a reactive ion etching used for the patterning stage of the n-type polysilicon layer 39b, and the polysilicon spacers 36bb and 39da/39db are left on the side surfaces of the polysilicon strips 36ba and 39ba/39bb as shown in FIG. 17E.

Figure 17F:
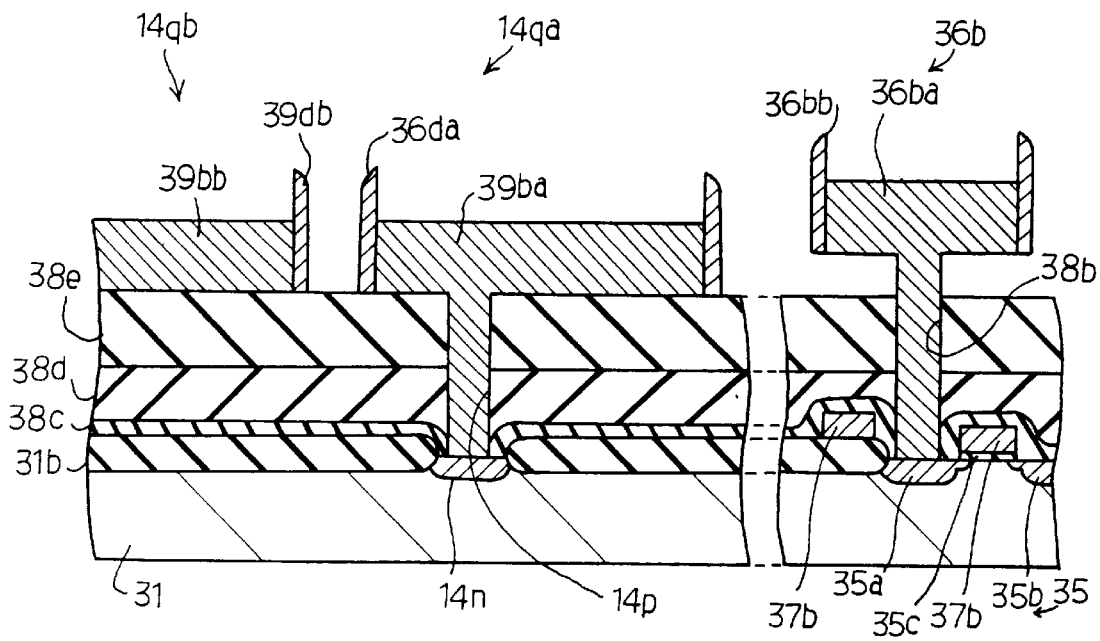

Using dilute hydrofluoric acid, the first spacing layer 39a and the spacing strips 39ca/39cb/39cc . . . are isotropically etched away, and a gap takes place between the polysilicon strip 36ba and the second inter-level insulating layer 38e. However, the polysilicon strips 14d, 14h, 39ba, 39bb . . . . are directly formed on the second inter-level insulating layer 38e as shown in FIG. 17F. The polysilicon strip 36ba and the polysilicon spacer 36bb form the fin storage node electrode 36b, and the polysilicon strips 39ba/39bb and the polysilicon spacers 39da/39db form the polysilicon strips 14qa/14qb.

Amorphous silicon is available for the storage node electrode and the polysilicon strips, and the n-type dopant impurity is introduced into the amorphous silicon through in-situ doping. It is advantageous to convert the amorphous silicon to polysilicon between the patterning stage and a formation of the dielectric films 36c, because the amorphous silicon is too high in sheet resistance. The storage node electrode 37b and the testing elements 34a–34c may be formed of refractory metal such as, for example, tungsten or refractory metal silicide such as, for example, tungsten silicide or titanium nitride.

Subsequently, the dielectric films 36c, 38f and 34r cover the storage node electrodes 36b, the second inter-level insulating layer 38e and the polysilicon strips 14f, 14h, 14qa, 14qb. In this instance, silicon nitride is deposited to 7 nanometers thick over the entire surface of the structure, and a surface portion of the silicon nitride layer is converted to silicon oxide by using pyrogenic oxidation in wet ambience at 800 degrees centigrade. Thus, the dielectric film is implemented by the lamination of silicon nitride layer and silicon oxide layer, and is equivalent to a silicon oxide film of 5 nanometers thick.

The dielectric film 36c is not limited to the lamination of the silicon nitride layer and the silicon oxide layer. The dielectric film 36c may be formed of tantalum oxide.

Finally, n-type polysilicon is deposited to 100 nanometers thick over the entire surface of the structure as similar to the n-type polysilicon for the storage node electrodes 36b, and the n-type polysilicon layer is patterned into the cell plate electrodes 36d. The storage node electrode 36b, the dielectric film 36c and the cell plate electrode 36d as a whole constitute the storage capacitor 36. The cell plate electrode 36d may be formed of in-situ n-type amorphous silicon or titanium nitride.

Thereafter, steps well known to a person skilled in the art are carried out, and the semiconductor device is completed. The storage node electrodes 36b is larger in capacitance than the storage node electrode 16b by virtue of the polysilicon spacer 36bb, and the chemical mechanical polishing makes the formation of the contact holes easy.

The second embodiment achieves all the advantages of the first embodiment. Namely, the polysilicon strips 14d, 14h, 14qa and 14qb are directly held in contact with the second inter-level insulating layer 38e, and are never broken nor chipped off during the patterning step of the n-type polysilicon layer 39b. For this reason, the manufacturer can evaluate the properties of the storage node electrode 36b, and the semiconductor device is improved in reliability. Moreover, any broken polysilicon piece does not short circuit the storage node electrodes 36b, and the production yield is enhanced.

Although particular embodiments of the present invention have been shown and described, it will be obvious to those skilled in the art that various changes and modifications may be made without departing from the spirit and scope of the present invention.

For example, the present invention is available for a semiconductor device having a circuit component projecting from an insulating layer and a testing element used for it. The memory cell may be incorporated in an ultra large scale integration together with another function block.

The storage node electrode may be formed of refractory metal such as, for example, tungsten or refractory metal silicide such as, for example, tungsten silicide.

The dielectric film may be formed of tantalum oxide ($Ta_2O_5$). The cell plate electrode 16d may be formed of in-situ n-type amorphous silicon or titanium nitride which create a good step coverage. However, if the tantalum oxide is used for the dielectric film, it is preferable to form the storage node electrode and the cell plate electrode from a refractory metal layer/a titanium nitride layer and a titanium nitride layer.

The configuration of the storage node electrode is not limited to those of the first and second embodiments. A storage node electrode may have more than one polysilicon spacer, and the surface may be roughened.

What is claimed is:

1. A semiconductor device fabricated on a semiconductor substrate, comprising:

an inter-level insulating structure formed over a major surface of said semiconductor substrate;

at least one circuit component formed on a first area of an upper surface of said inter-level insulating structure, and having a first member projecting from said first area of said inter-level insulating structure;

at least one testing element having a lower surface and at least one second member;

wherein said second member is held in contact with a second area of said upper surface of said inter-level insulating structure and used for evaluating said first member of said at least one circuit component; and wherein said lower surface is disposed completely in contact with at least one of said upper surface of said inter-level insulating structure and said semiconductor substrate.

2. The semiconductor device as set forth in claim 1, in which said first member of said at least one circuit component is a storage node electrode of a stacked storage capacitor of a dynamic random access memory cell, and said first member is held in contact with a first contact hole formed in said inter-level insulating structure with a source region of a field effect transistor.

3. The semiconductor device as set forth in claim 2, in which a conductive strip with a first height and a conductive spacer attached to a side surface of said conductive strip and having a second height larger than said first height form in combination said storage node electrode.

4. The semiconductor device as set forth in claim 2, in which said at least one testing element further has a second contact hole formed in said inter-level insulating structure, and said at least one second member and said second contact hole are checked to see whether or not said storage node electrode is exactly aligned with said first contact hole.

5. The semiconductor device as set forth in claim 2, in which said storage node electrode and said at least one second member are formed of a certain material, and a sheet resistance of said at least one second member is measured for estimating a sheet resistance of said storage node electrode.

6. The semiconductor device as set forth in claim 2, in which said storage node electrode and said at least one second member are respectively spaced from another storage node electrode over said first area of said upper surface of said inter-level insulating structure and another second member formed on said second area of said upper area of said inter-level insulating structure, and said at least one second member and said another second member are checked to see whether or not said storage node electrode is short circuited with said another storage node electrode.

7. A semiconductor device as in claim 1, wherein:
said lower surface is disposed completely in contact with said upper surface of said inter-level insulating structure.

* * * * *